US012756181B2

(12) United States Patent
Liu et al.

(10) Patent No.: US 12,756,181 B2
(45) Date of Patent: Oct. 6, 2026

(54) ELECTROSTATIC DISCHARGE CIRCUIT, DISPLAY SUBSTRATE, AND DISPLAY DEVICE

(71) Applicants: Chengdu BOE Optoelectronics Technology Co., Ltd., Chengdu (CN); BOE Technology Group Co., Ltd., Beijing (CN)

(72) Inventors: Jia Liu, Beijing (CN); Wenzhe Cai, Beijing (CN); Kaijie Deng, Beijing (CN); Rong Wang, Beijing (CN); Yao Huang, Beijing (CN); Xiangdan Dong, Beijing (CN); Ke Liang, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 107 days.

(21) Appl. No.: 18/860,018

(22) PCT Filed: Feb. 19, 2024

(86) PCT No.: PCT/CN2024/077561
§ 371 (c)(1),
(2) Date: Oct. 25, 2024

(87) PCT Pub. No.: WO2024/188019
PCT Pub. Date: Sep. 19, 2024

(65) Prior Publication Data

US 2025/0293511 A1 Sep. 18, 2025

(30) Foreign Application Priority Data

Mar. 16, 2023 (CN) ......................... 202310259122.1

(51) Int. Cl.
*H02H 9/02* (2006.01)
*H10D 30/67* (2025.01)
*H10D 89/60* (2025.01)

(52) U.S. Cl.
CPC ........ *H02H 9/025* (2013.01); *H10D 30/6755* (2025.01); *H10D 89/811* (2025.01)

(58) Field of Classification Search
CPC .. H02H 9/025; H10D 30/6755; H10D 89/811; H10D 86/423; H10D 89/921; H10D 86/60; H10D 89/931
(Continued)

(56) References Cited

U.S. PATENT DOCUMENTS 8,848,441 B2 * 9/2014 Sivero .................. H03K 17/102 365/189.11
9,697,908 B1 * 7/2017 Rathi ................ G11C 13/0007
(Continued)

FOREIGN PATENT DOCUMENTS

CN 103294251 A 9/2013
CN 107123646 A 9/2017
(Continued)

OTHER PUBLICATIONS

International Search Report for PCT/CN2024/077561 Mailed Apr. 3, 2024.
(Continued)

*Primary Examiner* — Dharti H Patel

(57) ABSTRACT

An electrostatic discharge circuit, comprising a first voltage line, a second voltage line and a plurality of transistors. A first voltage signal provided by the first voltage line is greater than a second voltage signal provided by the second voltage line. The plurality of transistors are connected in series between the first voltage line and the second voltage line. At least one of the plurality of transistors is an oxide
(Continued)

thin-film transistor, the oxide thin-film transistor comprises a top gate and a bottom gate, and the bottom gate is electrically connected to a third voltage line. The first voltage signal provided by the first voltage line is greater than a third voltage signal provided by the third voltage line.

20 Claims, 17 Drawing Sheets

(58) Field of Classification Search
USPC ............................................................ 361/56
See application file for complete search history.

(56) References Cited

U.S. PATENT DOCUMENTS

| | | | | |
|---|---|---|---|---|
| 10,115,741 | B2 * | 10/2018 | Matsuda | G11C 11/403 |
| 11,728,228 | B2 * | 8/2023 | Du | G09G 3/006 361/56 |
| 12,135,913 | B2 * | 11/2024 | Kim | G06F 3/147 |
| 12,615,784 | B2 * | 4/2026 | Or-Bach | G11C 16/0416 |
| 2002/0044111 | A1 * | 4/2002 | Yamazaki | H10H 29/142 345/83 |
| 2006/0220580 | A1 * | 10/2006 | Omata | G09G 3/3241 315/169.3 |
| 2007/0131989 | A1 * | 6/2007 | Liu | H10D 86/441 257/E27.111 |
| 2009/0194760 | A1 * | 8/2009 | Gosain | H10D 86/00 257/E29.273 |
| 2009/0322726 | A1 * | 12/2009 | Takasugi | G09G 3/3233 345/211 |
| 2017/0236844 | A1 | 8/2017 | Yamazaki et al. | |
| 2018/0151139 | A1 * | 5/2018 | Yi | G11C 19/287 |
| 2020/0365576 | A1 | 11/2020 | Kim | |
| 2020/0402577 | A1 * | 12/2020 | Onuki | G11C 16/0475 |
| 2021/0358906 | A1 * | 11/2021 | Cai | H10D 89/60 |
| 2022/0069573 | A1 * | 3/2022 | Kim | H10D 89/931 |
| 2022/0102560 | A1 * | 3/2022 | Tanaka | H10D 86/481 |
| 2023/0419896 | A1 * | 12/2023 | Zhang | G09G 3/3233 |
| 2024/0242679 | A1 * | 7/2024 | Park | G09G 3/32 |
| 2024/0306453 | A1 * | 9/2024 | Park | H10K 59/131 |
| 2025/0015193 | A1 * | 1/2025 | Yamazaki | H10D 30/6755 |
| 2025/0063903 | A1 * | 2/2025 | Kang | H10D 89/611 |
| 2025/0120266 | A1 * | 4/2025 | Zhang | H10K 59/1213 |

FOREIGN PATENT DOCUMENTS

| | | | | |
|---|---|---|---|---|
| CN | 107611142 | A | 1/2018 | |
| CN | 107895942 | A | 4/2018 | |
| CN | 110676253 | A | 1/2020 | |
| JP | 2006186399 | A | 7/2006 | |
| WO | WO-2021226833 | A1 * | 11/2021 | H10D 86/00 |

OTHER PUBLICATIONS

CN First Office Action issued Mar. 27, 2026 in Application No. 202310259122.1.

* cited by examiner

ELECTROSTATIC DISCHARGE CIRCUIT, DISPLAY SUBSTRATE, AND DISPLAY DEVICE

CROSS-REFERENCE TO RELATED APPLICATIONS

The present application is a U.S. National Phase Entry of International Application No. PCT/CN2024/077561 having an international filing date of Feb. 19, 2024, which claims priority of Chinese Patent Application No. 202310259122.1, filed on Mar. 16, 2023 to the China National Intellectual Property Administration, the contents of which should be regarded as being incorporated herein by reference in their entireties.

TECHNICAL FIELD

The present disclosure relates to, but is not limited to, the field of display technologies, in particular to an electro-static discharge circuit, a display substrate, and a display apparatus.

BACKGROUND

Electro-Static Discharge (ESD) phenomenon is prone to occur during the manufacturing and transportation of display panels. When the electro-static discharge occurs, a large current will be generated in a short time, which can easily cause electrostatic damage, e.g., leading to breakdown of the insulating dielectric and causing short-circuiting of the transistor. Therefore, it is necessary to provide an electro-static discharge circuit on the display panel.

SUMMARY

The following is a summary of subject matters described herein in detail. This summary is not intended to limit the protection scope of claims.

Embodiments of the present disclosure provide an electro-static discharge circuit, a display substrate, and a display apparatus.

In one aspect, an embodiment of the present disclosure provides an electro-static discharge circuit including a first voltage line, a second voltage line, and a plurality of transistors. A first voltage signal provided by the first voltage line is greater than a second voltage signal provided by the second voltage line. The plurality of transistors are connected in series between the first voltage line and the second voltage line. At least one transistor of the plurality of transistors is an oxide thin film transistor, the oxide thin film transistor includes a top gate and a bottom gate, and the bottom gate of the oxide thin film transistor is electrically connected to a third voltage line. The first voltage signal provided by the first voltage line is greater than a third voltage signal provided by the third voltage line.

In some exemplary implementations, the third voltage signal provided by the third voltage line is less than the second voltage signal provided by the second voltage line.

In some exemplary implementations, all transistors of the electro-static discharge circuit are oxide thin film transistors, and are N-type transistors.

In some exemplary implementations, the electro-static discharge circuit includes four oxide thin film transistors connected in series, wherein a first electrode of a first oxide thin film transistor is electrically connected to the first voltage line, a second electrode and a top gate of an i-th oxide thin film transistor are electrically connected to a first electrode of an (i+1)-th oxide thin film transistor, and a second electrode of a fourth oxide thin film transistor is electrically connected to the second voltage line, i is a positive integer greater than or equal to 1 and less than 4. Bottom gates of the four oxide thin film transistors are all electrically connected to the third voltage line; a top gate and a second electrode of a second oxide thin film transistor and a first electrode of a third oxide thin film transistor are all electrically connected to a signal input terminal.

In some exemplary implementations, the electro-static discharge circuit includes two oxide thin film transistors connected in series, wherein a first electrode of one oxide thin film transistor is electrically connected to the first voltage line, a top gate and a second electrode of the oxide thin film transistor are electrically connected to a first electrode of the other oxide thin film transistor and a signal input terminal, and a second electrode of the other oxide thin film transistor is electrically connected to the second voltage line; and bottom gates of the two oxide thin film transistors are all electrically connected to the third voltage line.

In another aspect, an embodiment of the present disclosure provides a display substrate including a base substrate and at least one signal line and at least one electro-static discharge circuit provided on the base substrate. The base substrate includes a display region and a peripheral region located on at least one side of the display region. At least one signal line and at least one electro-static discharge circuit are located in the peripheral region. Each electro-static discharge circuit is connected between a first voltage line and a second voltage line and is electrically connected to a signal line, configured to provide an electro-static discharge path to the signal line. The electro-static discharge circuit includes at least one oxide thin film transistor. The oxide thin film transistor includes an active layer, a bottom gate and a top gate, wherein the bottom gate is located on a side of the active layer close to the base substrate, the top gate is located on a side of the active layer away from the base substrate, and the bottom gate is electrically connected to a third voltage line. A first voltage signal provided by the first voltage line is greater than a second voltage signal provided by the second voltage line and greater than a third voltage signal provided by the third voltage line.

In some exemplary implementations, an orthographic projection of the top gate of the oxide thin film transistor on the base substrate is located within a range of an orthographic projection of the bottom gate of the oxide thin film transistor on the base substrate.

In some exemplary implementations, bottom gates of a plurality of oxide thin film transistors of the at least one electro-static discharge circuit are of an integral structure.

In some exemplary implementations, the first voltage line, the second voltage line, and the third voltage line are located at a side of the top gate of the oxide thin film transistor away from the base substrate.

In some exemplary implementations, the display region is provided with a plurality of data lines; the display substrate includes a plurality of signal lines and a plurality of electro-static discharge circuits, the plurality of signal lines includes: a plurality of data lead lines; the plurality of data lead lines are electrically connected to the plurality of data lines respectively. The plurality of electro-static discharge circuits include: a plurality of first electro-static discharge circuits; at least one data lead line is electrically connected to at least one first electro-static discharge circuit; the at least one first electro-static discharge circuit is adjacent to the connected data lead line in a first direction, a first electrostatic discharge circuit includes a plurality of oxide thin film transistors, the plurality of oxide thin film transistors of the first electro-static discharge circuit are arranged along a second direction, and the first direction intersects the second direction.

In some exemplary implementations, the plurality of data lead lines includes a plurality of groups of data lead lines, at least one group of data lead lines includes two adjacent data lead lines disposed in different layers, and orthographic projections of the two adjacent data lead lines on the base substrate do not overlap.

In some exemplary implementations, first electro-static discharge circuits to which the two data lead lines of the at least one group of data lead lines are respectively electrically connected are located between the two data lead lines, adjacent in the second direction, and electrically connected to a same first voltage line.

In some exemplary implementations, the first electro-static discharge circuits to which the two data lead lines of the at least one group of data lead lines are respectively electrically connected are disposed symmetrically with respect to the first voltage line.

In some exemplary implementations, one of the at least one group of data lead lines and a bottom gate of an oxide thin film transistor of the connected first electro-static discharge circuit are disposed in a same layer, and the other data lead line is located at a side of the bottom gate of the oxide thin film transistor close to the base substrate.

In some exemplary implementations, the display substrate includes a plurality of signal lines and a plurality of electro-static discharge circuits, the plurality of signal lines include a plurality of drive lead lines, the plurality of electro-static discharge circuits include a plurality of second electro-static discharge circuits; at least one drive lead line is electrically connected to at least two second electro-static discharge circuits; at least two second electro-static discharge circuits electrically connected with one drive lead line are arranged in an array.

In some exemplary implementations, at least two second electro-static discharge circuits electrically connected with one drive lead line are disposed symmetrically with respect to the drive lead line.

In some exemplary implementations, the display substrate includes a plurality of signal lines and a plurality of electro-static discharge circuits, the plurality of signal lines include a plurality of drive signal lines; the plurality of electro-static discharge circuits include a plurality of third electro-static discharge circuits; at least one drive signal line is electrically connected to at least one third electro-static discharge circuit; a third electro-static discharge circuit includes four oxide thin film transistors connected in series, and the four oxide thin film transistors are arranged in an array.

In some exemplary implementations, the display substrate further includes: at least one auxiliary resistance trace located in the peripheral region; the at least one signal line includes a first trace electrically connected to the at least one electro-static discharge circuit and a second trace located at a side of the first trace close to the display region, and the first trace and the second trace are electrically connected through the auxiliary resistance trace.

In some exemplary implementations, an orthographic projection of the at least one auxiliary resistance trace on the base substrate is a serpentine trace.

In another aspect, an embodiment of the present disclosure provides a display apparatus, which includes the aforementioned display substrate.

In another aspect, an embodiment of the present disclosure provides a display substrate including a base substrate, at least one signal line, and at least one electro-static discharge circuit. The base substrate includes a display region and a peripheral region located on at least one side of the display region. At least one signal line and at least one electro-static discharge circuit located in the peripheral region. Each electro-static discharge circuit includes a plurality of transistors connected in series between a first voltage line and a second voltage line. At least one transistor of the plurality of transistors is an oxide thin film transistor. The oxide thin film transistor includes a top gate and a bottom gate, the bottom gate of the oxide thin film transistor is electrically connected to a third voltage line. A first voltage signal provided by the first voltage line is greater than a second voltage signal provided by the second voltage line and greater than a third voltage signal provided by the third voltage line. A signal line is electrically connected to the at least one electro-static discharge circuit, the signal line is configured to discharge static electricity through the at least one electro-static discharge circuit; a plurality of transistors in at least one electro-static discharge circuit to which the signal line is electrically connected are arranged in an array, or a plurality of electro-static discharge circuits to which the signal line is electrically connected are arranged in an array.

In some exemplary implementations, the display substrate includes a plurality of signal lines and a plurality of electro-static discharge circuits, the plurality of signal lines include: a plurality of data lead lines; the display region is provided with a plurality of data lines; the plurality of data lead lines are electrically connected to the plurality of data lines respectively; the plurality of electro-static discharge circuits include: a plurality of first electro-static discharge circuits, and at least one data lead line is electrically connected to at least one first electro-static discharge circuit; the first electro-static discharge circuit includes a plurality of oxide thin film transistors, and the plurality of oxide thin film transistors are arranged in an array at one side of the connected data lead line.

In some exemplary implementations, the plurality of signal lines further include a plurality of drive lead lines, and the plurality of electro-static discharge circuits further include a plurality of second electro-static discharge circuits; the plurality of second electro-static discharge circuits are located at a side of the plurality of first electro-static discharge circuits away from the display region. At least one drive lead line is electrically connected to at least two second electro-static discharge circuits, at least two second electro-static discharge circuits electrically connected to one drive lead line are arranged in an array, at least one second electro-static discharge circuit includes a plurality of oxide thin film transistors, and the plurality of oxide thin film transistors are arranged in an array at one side of the connected drive lead line.

In some exemplary implementations, the display substrate further includes: at least one auxiliary resistance trace located in the peripheral region; at least one signal line includes a first trace electrically connected to the at least one electro-static discharge circuit and a second trace located at a side of the first trace close to the display region, and the first trace and the second trace are electrically connected through the auxiliary resistance trace.

Other aspects of the present disclosure may be comprehended after the drawings and the detailed descriptions are read and understood.

BRIEF DESCRIPTION OF DRAWINGS

Accompanying drawings are used for providing further understanding of technical solutions of the present disclosure, constitute a portion of the specification, and are used for explaining the technical solutions of the present disclosure together with embodiments of the present disclosure, but do not constitute limitations on the technical solutions of the present disclosure. Shapes and sizes of one or more components in the drawings do not reflect actual scales, but are only intended to schematically describe contents of the present disclosure.

DETAILED DESCRIPTION

Figure 1A:
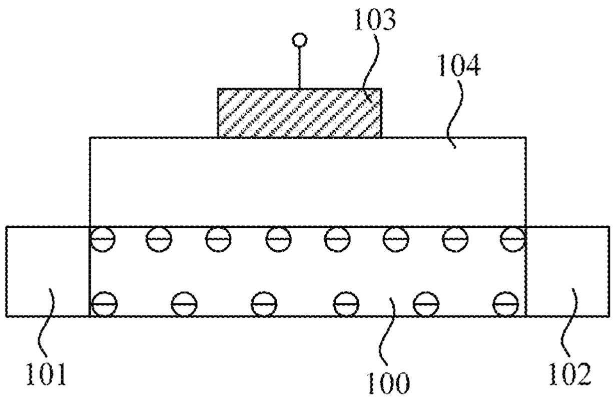
FIGS. 1A and 1B are schematic diagrams of an operation principle of an oxide thin film transistor.

The embodiments of the present disclosure will be described below with reference to the drawings in detail. Implementations may be implemented in a plurality of different forms. Those of ordinary skills in the art may easily understand such a fact that implementations and contents may be transformed into other forms without departing from the purpose and scope of the present disclosure. Therefore, the present disclosure should not be explained as being limited to the contents recorded in the following implementations only. The embodiments and features in the embodiments of the present disclosure may be randomly combined with each other if there is no conflict.

In the drawings, a size of one or more constituent elements, a thickness of a layer, or a region is sometimes exaggerated for clarity. Therefore, one implementation of the present disclosure is not necessarily limited to the size, and a shape and a size of one or more components in the drawings do not reflect an actual scale. In addition, the accompanying drawings schematically illustrate ideal examples, and an implementation of the present disclosure is not limited to shapes, numerical values, or the like shown in the drawings.

Ordinal numerals “first”, “second”, “third”, etc., in the specification are set not to form limits in numbers but only to avoid confusion between composition elements. In the present disclosure, "plurality" represents two or more than two.

In the specification, for convenience, expressions "central", "above", "below", "front", "back", "vertical", "horizontal", "top", "bottom", "inside", "outside", etc., indicating directional or positional relationships are used to illustrate positional relationships between the composition elements with reference to the accompanying drawings, not to indicate or imply that involved devices or elements are required to have specific orientations and be structured and operated with the specific orientations but only to easily and simply describe the present specification, and thus should not be understood as limitations on the present disclosure. The positional relationships between the constituent elements are changed as appropriate according to directions of the constituent elements described. Therefore, appropriate replacements based on situations are allowed, which is not limited to the expressions in the specification.

In the specification, unless otherwise specified and defined, terms "mounting", "mutual connection", and "connection" should be understood in a broad sense. For example, it may be a fixed connection, a detachable connection, or an integral connection; it may be a mechanical connection or a connection; it may be a direct connection, an indirect connection through a middleware, or an internal communication inside two elements. Those of ordinary skills in the art may understand meanings of the aforementioned terms in the present disclosure according to situations.

In the specification, an "electrical connection" includes a case that constituent elements are connected together through an element with a certain electrical action. The "element with a certain electrical effect" is not particularly limited as long as electrical signals between the connected constituent elements may be transmitted. Examples of the "element having some electrical effect" not only include an electrode and a wiring, but also include a switching element such as a transistor, a resistor, an inductor, a capacitor, another element with multiple functions, etc.

In the specification, a transistor refers to an element which at least includes three terminals, i.e., a gate electrode, a drain electrode, and a source electrode. The transistor has a channel region between the drain electrode (drain electrode terminal, drain electrode region, or drain) and the source electrode (source electrode terminal, source electrode region, or source), and a current can flow through the drain electrode, the channel region, and the source electrode. In the specification, the channel region refers to a region through which a current mainly flows.

In the specification, a first electrode may be a drain and a second electrode may be a source, or, a first electrode may be a source and a second electrode may be a drain. In a case that transistors with opposite polarities are used, or in a case that a direction of a current is changed during operation of a circuit, or the like, functions of the "source electrode" and the "drain electrode" are sometimes interchangeable. Therefore, the "source electrode" and the "drain electrode" are interchangeable in the specification. In addition, the gate may also be referred to as a control electrode.

In the specification, "parallel" refers to a state in which an angle formed by two straight lines is −10° or more and 10° or less, and thus may include a state in which the angle is −5° or more and 5° or less. In addition, "perpendicular" refers to a state in which an angle formed by two straight lines is 80° or more and 100° or less, and thus may include a state in which the angle is 85° or more and 95° or less.

In this specification, a circle, oval, triangle, rectangle, trapezoid, pentagon or hexagon, etc. is not strictly speaking, but may be an approximate circle, oval, triangle, rectangle, trapezoid, pentagon or hexagon, etc. Some small deformations due to tolerances may exist, for example, lead angles, curved edges and deformations thereof may exist.

In the present disclosure, "about" and "substantially" refer to that a boundary is not defined strictly and a case within a range of process and measurement errors is allowed. In the present disclosure, "substantially the same" refers to a case where numerical values differ by less than 10%. "Symmetry" in the present disclosure refers to that a boundary is not defined strictly and a case where approximate symmetry within a range of process and measurement errors is allowed.

In the present disclosure, "A extends along a B direction" means that A may include a main body portion and a secondary portion connected with the main body portion, the main body portion is a line, a line segment, or a strip-shaped body, the main body portion extends along the B direction, and a length of the main body portion extending along the B direction is greater than a length of the secondary portion extending along another direction. "A extends along the B direction" in the present disclosure means "the main body portion of A extends along the B direction".

In the present disclosure, a serpentine trace refers to a bending curve. For example, after one end of the trace extends along one direction for a certain distance, it bends circuitously and extends along a direction opposite to the direction for another certain distance, and bends circuitously again and extends along the direction. In this way, circuitous bending is repeated for several times to form the serpentine trace.

In some implementations, oxide thin film transistors are gradually becoming the main material for next generation display devices due to their fast response speed and high on/off current ratio. However, oxide thin film transistors are N-type transistors which work in the accumulation region, and it is difficult to achieve a positive threshold voltage (Vth), thereby leading to a result far from satisfactory in the popularization of oxide thin film transistors.

Figure 1B:
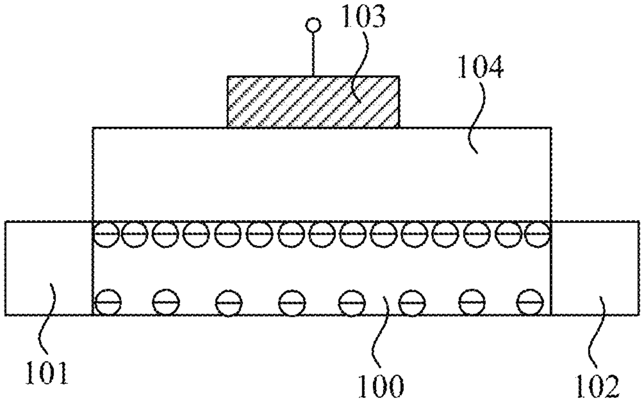

FIGS. 1A and 1B are schematic diagrams of an operation principle of an oxide thin film transistor. In some examples, as shown in FIGS. 1A and 1B, an oxide thin film transistor may include an active layer 100, a Gate 103, a Source 101, and a Drain 102. A first Gate Insulator (GI) layer 104 is provided between the active layer 100 and the gate 103. The active layer 100 may be made of a metal oxide material, which may be, for example, Indium Gallium Zinc Oxide (IGZO).

As shown in FIG. 1A, when the threshold voltage Vth of the oxide thin film transistor is greater than 0, since the IGZO itself is an N-type semiconductor, when the oxide thin film transistor is turned on, it operates in a carrier accumulation region, and the carriers that participate in the formation of the current are electrons. When the gate-source voltage difference Vgs of the oxide transistor equals to 0, the gate-source voltage difference Vgs is less than the threshold voltage Vth, the oxide thin film transistor is in an off state, and its carrier concentration at the interface between the gate insulator layer 104 and the active layer 100 (e.g., IGZO) is insufficient to form a current.

As shown in FIG. 1B, when the threshold voltage Vth of the oxide thin film transistor is less than 0, and when the gate-source voltage difference Vgs equals to 0, the gate-source voltage difference Vgs is greater than the threshold voltage Vth, the oxide thin film transistor is in an on state, and its carrier concentration at the interface between the gate insulator layer 104 and the active layer 100 (e.g., IGZO) may form a current.

As can be seen, when both the threshold voltage Vth and the gate-source voltage difference Vgs of the oxide thin film transistor are less than 0V, the gate-source voltage difference Vgs may be greater than the threshold voltage Vth, so that the oxide thin film transistor is still in an on state. In some implementations, the oxide thin film transistor is used in the electro-static discharge circuit of the display substrate, and due to the above-described problems of the oxide thin film transistor, the stability of the electro-static discharge circuit is easily affected, which results in defect of the display product.

The present embodiment provides an electro-static discharge circuit, a display substrate, and a display apparatus, which are beneficial to improving the performance of the oxide thin film transistor in the electro-static discharge circuit, enhancing the stability of the electro-static discharge circuit, and thereby improving the anti-static capability of the display substrate.

The present embodiment provides an electro-static discharge circuit including a first voltage line, a second voltage line, and a plurality of transistors. A first voltage signal provided by the first voltage line is greater than a second voltage signal provided by the second voltage line. The plurality of transistors are connected in series between the first voltage line and the second voltage line. At least one transistor of the plurality of transistors is an oxide thin film transistor, the oxide thin film transistor includes a top gate and a bottom gate, and the bottom gate of the oxide thin film transistor is electrically connected to a third voltage line. The first voltage signal provided by the first voltage line is greater than a third voltage signal provided by the third voltage line.

The transistors connected in series in this example mean that a first electrode of one transistor is electrically connected to a second electrode of an adjacent transistor, or a second electrode of one transistor is electrically connected to a first electrode of an adjacent transistor.

The electro-static discharge circuit according to the present embodiment adopts an oxide thin film transistor, and the bottom gate of the oxide thin film transistor is electrically connected to the third voltage line, so that the threshold voltage of the oxide thin film transistor may be shifted to a positive value, enabling the oxide transistor to be successfully turned off when the gate-source voltage difference is 0V, thereby enhancing the stability of the electro-static discharge circuit.

In some examples, the magnitude of the third voltage signal may be determined according to a degree of shifting of the threshold voltage of the oxide thin film transistor. For example, the second voltage signal provided by the second voltage line may be different from the third voltage signal provided by the third voltage line. For example, the third voltage signal may be less than 0V. For example, the third voltage signal provided by the third voltage line may be less than the second voltage signal provided by the second voltage line. In this example, by setting the third voltage signal to be less than the second voltage signal and the first voltage signal, the forward bias effect of the threshold voltage of the oxide thin film transistor can be made more obvious.

Figure 2:
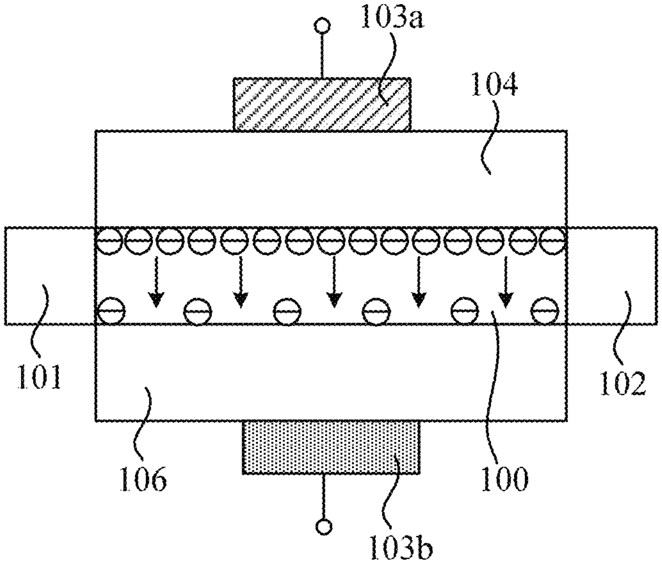
FIG. 2 is a schematic diagram of an operation principle of an oxide thin film transistor according to at least one embodiment of the present disclosure.

FIG. 2 is a schematic diagram of an operation principle of an oxide thin film transistor according to at least one embodiment of the present disclosure. In some examples, as shown in FIG. 2, the oxide thin film transistor according to the present example may include an active layer 100, a top gate 103*a*, a bottom gate 103*b*, a source 101, and a drain 102. A first gate insulator layer 104 is provided between the active layer 100 and the top gate 103*a*, and a second gate insulator layer 106 is provided between the active layer 100 and the bottom gate 103*b*. The active layer 100 may be made of a metal oxide material, such as IGZO.

In some examples, as shown in FIG. 2, when the threshold voltage Vth of the oxide thin film transistor is less than 0 and the gate-source voltage difference Vgs is 0, the oxide thin film transistor is in an on state, and the carrier concentration at the interface between the first gate insulator layer 104 and the active layer 100 may form a current. When the third voltage line is connected to the bottom gate 103*b* of the oxide thin film transistor, induced holes generated at the interface between the second gate insulator layer 106 and the active layer 100 may be compounded with the electrons on the surface of the active layer 100. Since the thickness of the active layer 100 is very thin, electrons at the interface between the first gate insulator layer 104 and the active layer 100 may diffuse to the interface between the second gate insulator layer 106 and the active layer 100, so that electrons at the interface between the first gate insulator layer 104 and the active layer 100 are reduced and are insufficient to form a current. In this way, by electrically connecting the bottom gate 103*b* to the third voltage line, the threshold voltage Vth may be made greater than 0, that is, a forward bias of the threshold voltage Vth is achieved, so that the oxide thin film transistor may be in an off state when the gate-source voltage difference Vgs is 0. In this example, by making the threshold voltage of the oxide thin film transistor in the forward bias, the oxide thin film transistor can be successfully turned off when the gate-source voltage difference is 0.

Figure 3:
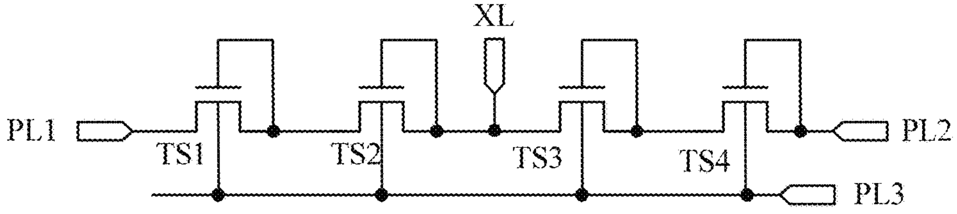
FIG. 3 is a circuit diagram of an electro-static discharge circuit according to at least one embodiment of the present disclosure.

FIG. 3 is a circuit diagram of an electro-static discharge circuit according to at least one embodiment of the present disclosure. In some examples, as shown in FIG. 3, the electro-static discharge circuit may include four transistors connected in series, such as transistors TS1 to TS4. The four transistors may all be N-type transistors and be oxide thin film transistors. Each of the transistors TS1 to TS4 may have a top gate and a bottom gate. Herein, a first electrode of the first transistor is electrically connected to a first voltage line PL1, a second electrode and the top gate of an i-th transistor are electrically connected to a first electrode of an (i+1)-th transistor, and a second electrode of the fourth transistor is electrically connected to a second voltage line PL2, and i is a positive integer greater than or equal to 1 and less than 4. In other words, the top gate and a second electrode of the transistor TS1 are electrically connected to a first electrode of the transistor TS2, and a first electrode of the transistor TS1 is electrically connected to the first voltage line PL1; the top gate and a second electrode of the transistor TS2 are electrically connected to a first electrode of the transistor TS3, the top gate and a first electrode of the transistor TS3 are electrically connected to a second electrode of the transistor TS4, and the top gate and a second electrode of the transistor TS4 are electrically connected to the second voltage line PL2. A signal input terminal XL is electrically connected to the top gate and the second electrode of the transistor TS2 and the first electrode of the transistor TS3. The bottom gates of the transistors TS1 to TS4 are all electrically connected to the third voltage line PL3.

In some examples, the first voltage line PL1 may continuously provide a first voltage signal VGH, for example, the first voltage signal VGH may be a constant high potential signal; the second voltage line PL2 may continuously supply a second voltage signal VGL1, for example, the second voltage signal VGL1 may be a constant low potential signal; and the third voltage line PL3 may continuously supply a third voltage signal VGL2, for example, the third voltage signal VGL2 may be a constant low potential signal. The first voltage signal VGH may be greater than the second voltage signal VGL1 and greater than the third voltage signal VGL2. The second voltage signal VGL1 may be greater than the third voltage signal VGL2. By electrically connecting the bottom gates of the plurality of oxide thin film transistors to the third voltage line and providing the third voltage signal lower than the first voltage signal, a forward bias of the threshold voltage Vth of the oxide thin film transistor can be achieved, so that the oxide thin film transistor can be in the off state when the gate-source voltage difference Vgs of the oxide thin film transistor is 0. In this example, by making the threshold voltage of the oxide thin film transistor in the forward bias, the oxide thin film transistor can be successfully turned off when the gate-source voltage difference is 0.

In some examples, when an instantaneous high voltage (e.g., 100V) occurs in the signal input terminal XL due to the accumulation of positive charges, the transistor TS2 and the transistor TS1 may be turned on to discharge the positive charges through the first voltage line PL1; when an instantaneous low voltage (e.g. −100 V) occurs in the signal input terminal XL due to the accumulation of negative charges, the transistor ST3 and the transistor ST4 may be turned on to discharge the negative charges through the second voltage line PL2.

Figure 4:
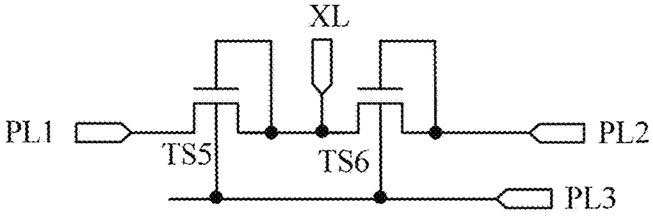
FIG. 4 is another circuit diagram of an electro-static discharge circuit according to at least one embodiment of the present disclosure.

FIG. 4 is another circuit diagram of an electro-static discharge circuit according to at least one embodiment of the present disclosure. In some examples, as shown in FIG. 4, the electro-static discharge circuit may include two transistors TS5 and TS6 connected in series. Both the transistor TS5 and the transistor TS6 may be N-type transistors and oxide thin film transistors. A top gate and a second electrode of the transistor TS5 are electrically connected to a first electrode of the transistor TS6, a first electrode of the transistor TS5 is electrically connected to a first voltage line, and a top gate and a second electrode of the transistor TS6 are electrically connected to a second voltage line PL2. Both bottom gates of the transistor TS5 and the transistor TS6 are electrically connected to a third voltage line PL3. A signal input terminal XL is electrically connected to the top gate and the second electrode of the transistor TS5 and the first electrode of the transistor TS6.

In this example, the first electrodes of the transistor TS5 and the transistor TS6 are both connected to their own top gates, which can form an equivalent diode connection. When an instantaneous high voltage occurs in the signal input terminal XL due to the accumulation of positive charges, the equivalent diode of the transistor TS5 is turned on, and the positive charges can be discharged through the first voltage line PL1. When an instantaneous low voltage occurs in the signal input terminal XL due to the accumulation of negative charges, the equivalent diode of the transistor TS6 is turned on, and the negative charges can be discharged through the second voltage line PL2.

In some other examples, the electro-static protection circuit may include a P-type transistor and an N-type transistor, and the N-type transistor is an oxide thin film transistor. A top gate of the N-type transistor is electrically connected to a drain thereof and electrically connected to the second voltage line; a gate and a drain of the P-type transistor are electrically connected and electrically connected to the first voltage line. A bottom gate of the N-type transistor may be electrically connected to the third voltage line. The signal input terminal may be electrically connected to a source of the N-type transistor and a source of the P-type transistor. When the positive charges accumulated at the signal input terminal cause the potential of the source of the P-type transistor to be higher than the first voltage signal VGH provided by the first voltage line, the P-type transistor may be turned on for electro-static discharge. When the negative charges accumulated at the signal input terminal cause the potential of the source of the N-type transistor to be lower than the second voltage signal VGL1 provided by the second voltage line, the N-type transistor may be turned on for electro-static discharge. However, the present embodiment does not limit the quantity of oxide thin film transistors in the electro-static discharge circuit.

The present embodiment also provides a display substrate including a base substrate, and at least one signal line and at least one electro-static discharge circuit provided on the base substrate. The base substrate includes a display region and a peripheral region located on at least one side of the display region. At least one signal line and at least one electro-static discharge circuit are located in the peripheral region. Each electro-static discharge circuit is connected between a first voltage line and a second voltage line, is electrically connected to a signal line, and is configured to provide an electro-static discharge path to the signal line. The electro-static discharge circuit includes at least one oxide thin film transistor. The oxide thin film transistor includes an active layer, a bottom gate and a top gate, wherein the bottom gate is located on a side of the active layer close to the base substrate, the top gate is located on a side of the active layer away from the base substrate, and the bottom gate is electrically connected to a third voltage line. A first voltage signal provided by the first voltage line is greater than a second voltage signal provided by the second voltage line and greater than a third voltage signal provided by the third voltage line. For example, the second voltage signal provided by the second voltage line may be greater than the third voltage signal provided by the third voltage line.

In the display substrate according to the present example, by electrically connecting the bottom gate of the oxide thin film transistor in the electro-static discharge circuit to the third voltage line, the threshold voltage of the oxide thin film transistor can be shifted to a positive value, so that the oxide transistor can be successfully turned off when the gate-source voltage difference is 0V, thereby improving the performance of the oxide thin film transistor in the electro-static discharge circuit, enhancing the stability of the electro-static discharge circuit, and thus improving the anti-static capability of the display substrate.

In some exemplary implementations, an orthographic projection of the top gate of the oxide thin film transistor on the base substrate may be located within a range of the orthographic projection of the bottom gate of the oxide thin film transistor on the base substrate. In other words, the orthographic projection of the bottom gate of the oxide thin film transistor on the base substrate may cover the orthographic projection of the top gate of the oxide thin film transistor on the base substrate. In this example, by providing the orthographic projection of the bottom gate of the oxide thin film transistor on the base substrate to cover the orthographic projection of the top gate of the oxide thin film transistor on the base substrate, the light shading of the channel region of the active layer of the oxide thin film transistor can be achieved to ensure the performance of the oxide thin film transistor.

In some exemplary implementations, bottom gates of a plurality of oxide thin film transistors of at least one electrostatic discharge circuit may be of an integral structure. In this example, the bottom gates of the plurality of oxide thin film transistors are provided as an integral structure, which can facilitate the realization of an electrical connection between the bottom gates and the third voltage line, reduce connection vias between the bottom gates and the third voltage line, and facilitates the uniformity of transmitting the third voltage signal by the bottom gates.

In some exemplary implementations, the display substrate may include a plurality of signal lines and a plurality of electro-static discharge circuits. For example, the plurality of signal lines may include a plurality of data lead lines, the plurality of electro-static discharge circuits may include a plurality of first electro-static discharge circuits, and at least one data lead line may be electrically connected to at least one first electro-static discharge circuit. For another example, the plurality of signal lines may include a plurality of drive lead lines, the plurality of electro-static discharge circuits may include a plurality of second electro-static discharge circuits, and at least one drive lead line may be electrically connected to at least two second electro-static discharge circuits. For another example, the plurality of signal lines may include a plurality of drive signal lines, and the plurality of electro-static discharge circuits may include a plurality of third electro-static discharge circuits. At least one drive signal line may be electrically connected to at least one third electro-static discharge circuit. In this example, by providing corresponding electro-static discharge circuits to a plurality of signal lines, the anti-static capability of the display substrate can be improved.

In some examples, the display substrate may be a Liquid Crystal Display (LCD) substrate, or may be an Organic Light Emitting Diode (OLED) display substrate, or may be a Plasma Display Panel (PDP), or may be an Electrophoresis Display substrate (EPD). An OLED is an active light emitting display device that has advantages, such as self-luminescence, a wide viewing angle, a high contrast ratio, low power consumption, and an extremely high response speed. With continuous development of display technologies, a flexible display apparatus that uses the OLED as a light-emitting device and uses a Thin Film Transistor (TFT) for signal control has become a mainstream product in the field of display at present.

Solutions of the embodiments will be described below through some examples. The display substrate is described in the following examples by taking an OLED display substrate as an example.

Figure 5:
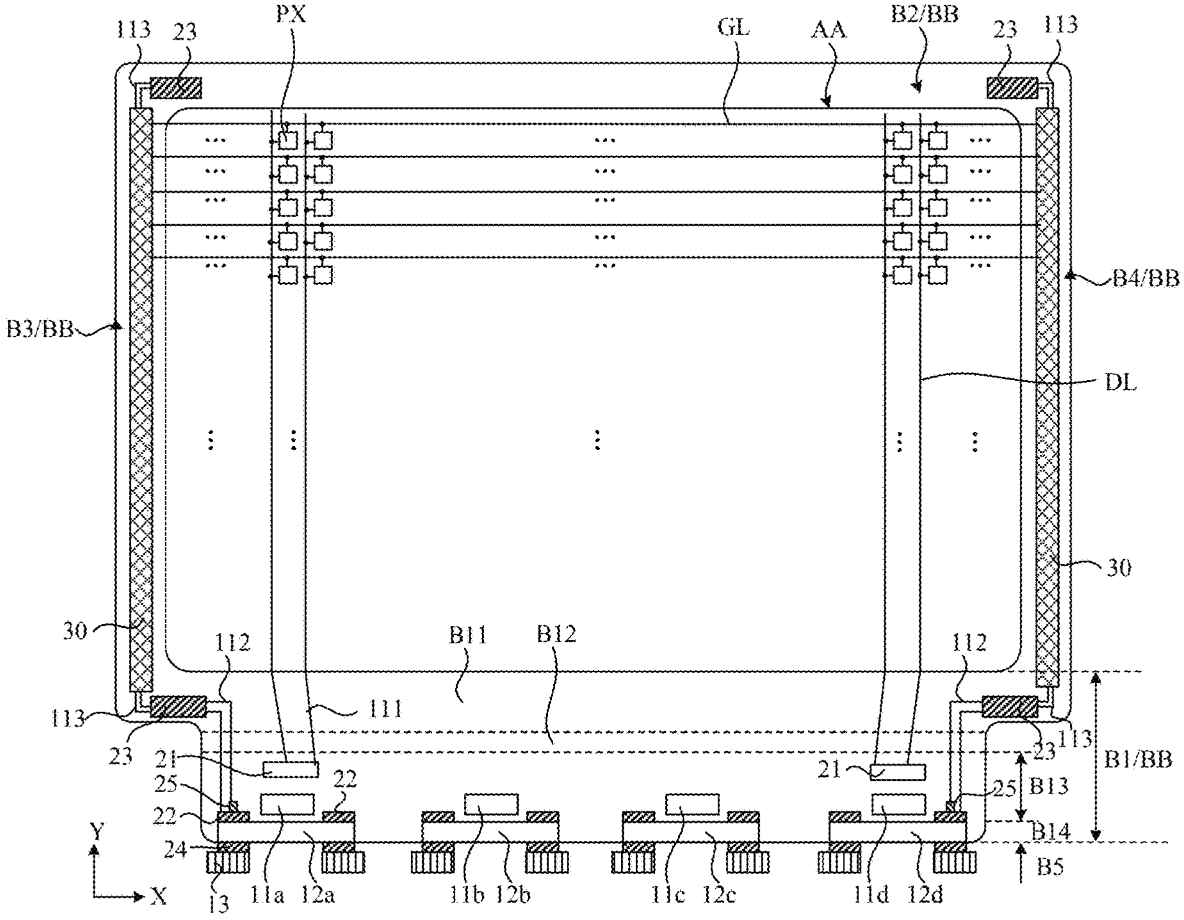
FIG. 5 is a schematic plan view of a display substrate according to at least one embodiment of the present disclosure.

FIG. 5 is a schematic plan view of a display substrate according to at least one embodiment of the present disclosure. In some examples, as shown in FIG. 5, the display substrate may include a display region AA, and a peripheral region BB located at a periphery of the display region AA. The peripheral region BB may include a first bezel region B1 and a second bezel region B2 located on opposite sides of the display region AA in a second direction Y, and a third bezel region B3 and a fourth bezel region B4 located on opposite sides of the display region AA in a first direction X. For example, the first bezel region B1 may be a lower bezel of the display substrate, the second bezel region B2 may be an upper bezel of the display substrate, the third bezel region B3 may be a left bezel of the display substrate, and the fourth bezel region B4 may be a right bezel of the display substrate. Two ends of the first bezel region B1 connect with the third bezel region B3 and the fourth bezel region B4, and two ends of the second bezel region B2 connect with the third bezel region B3 and the fourth bezel region B4.

In some examples, as shown in FIG. 5, the display region AA may be a planar region including a plurality of sub-pixels PX forming a pixel array, the plurality of sub-pixels PX are configured to display a dynamic picture or a static image. The display region AA may be referred to as an effective region. In some examples, the display substrate may be a flexible substrate. Accordingly, the display substrate may be deformable, for example, crimped, bent, folded, or curled.

In some examples, as shown in FIG. 5, the display region AA may at least include a plurality of sub-pixels PX, a plurality of gate lines GL, and a plurality of data lines DL. The plurality of gate lines GL may extend in the first direction X, and the plurality of data lines DL may extend in the second direction Y. Orthographic projections of the plurality of gate lines GL on the base substrate and orthographic projections of the plurality of data lines DL on the base substrate intersect to form a plurality of sub-pixel regions, and one sub-pixel PX is disposed in each sub-pixel region. The plurality of data lines DL are electrically connected with the plurality of sub-pixels PX, and the plurality of data lines DL may be configured to provide data signals to the plurality of sub-pixels PX. The plurality of gate lines GL are electrically connected with the plurality of sub-pixels PX, and the plurality of gate lines GL may be configured to provide a gate control signal to the plurality of sub-pixels PX. In some examples, the gate control signal may include a scan signal, or may include a scan signal and a light emitting control signal.

In some examples, as shown in FIG. 5, the first direction X may be an extension direction (row direction) of the gate lines GL in the display region AA, and the second direction Y may be an extension direction (column direction) of the data lines DL in the display region AA. The first direction X intersects with the second direction Y, for example, the first direction X and the second direction Y may be perpendicular to each other.

In some examples, a pixel unit of the display region AA may include three sub-pixels which are a red sub-pixel, a green sub-pixel, and a blue sub-pixel respectively. However, the present embodiment is not limited thereto. In some examples, one pixel unit may include four sub-pixels, and the four sub-pixels are a red sub-pixel, a green sub-pixel, a blue sub-pixel, and a white sub-pixel respectively.

In some examples, a shape of a sub-pixel may be a rectangle, a rhombus, a pentagon, or a hexagon. When one pixel unit includes three sub-pixels, the three sub-pixels may be arranged in parallel in a horizontal direction, in parallel in a vertical direction, or in a shape of the Chinese character "品". When one pixel unit includes four sub-pixels, the four sub-pixels may be arranged in parallel in a horizontal direction, in parallel in a vertical direction, or in a shape forming a square. However, the present embodiment is not limited thereto.

In some examples, one sub-pixel may include a pixel circuit and a light emitting element electrically connected with the pixel circuit. The pixel circuit may include a plurality of transistors and at least one capacitor. For example, the pixel circuit may have a 3T1C, 4T1C, 5T1C, 5T2C, 6T1C, 7T1C, or 8T1C structure. In the above-mentioned circuit structures, T refers to a thin film transistor, C refers to a capacitor, a number before T represents a quantity of thin film transistors in the circuit, and a number before C represents a quantity of capacitors in the circuit. In some examples, the plurality of transistors in the pixel circuit may be P-type transistors or may be N-type transistors. Usage of same type of transistors in the pixel circuit may simplify a process flow, reduce a process difficulty of the display substrate, and improve a yield of a product. In some other examples, the plurality of transistors in the pixel circuit may include a P-type transistor and an N-type transistor.

In some examples, low temperature poly silicon thin film transistors, or oxide thin film transistors, or both a low temperature poly silicon thin film transistor(s) and an oxide thin film transistor(s) may be used as the plurality of transistors in the pixel circuit. Low Temperature Poly Silicon (LTPS) is adopted for an active layer of a low temperature poly silicon thin film transistor, and an oxide semiconductor (Oxide) is adopted for an active layer of an oxide thin film transistor. The low temperature poly silicon thin film transistor has advantages such as a high migration rate and fast charging, and the oxide thin film transistor has advantages such as a low leakage current. The low temperature poly silicon thin film transistor and the oxide thin film transistor are integrated on one display substrate, that is, an LTPS+Oxide (LTPO for short) display substrate, advantages of both the low temperature poly silicon thin film transistor and the oxide thin film transistor may be utilized, so that low-frequency drive can be achieved, power consumption can be reduced, and display quality can be improved.

In some examples, the light emitting element may be any one of a Light Emitting Diode (LED), an Organic Light emitting Diode (OLED), a Quantum dot Light emitting Diode (QLED), a Micro LED (including a mini-LED or a micro-LED) and the like. For example, the light emitting element may be an OLED, and the light emitting element may emit red light, green light, blue light, or white light, etc. under driving of a pixel circuit corresponding to the light emitting element. A color of light emitted by the light emitting element may be determined as required. In some examples, the light emitting element may include an anode, a cathode, and an organic light emitting layer located between the anode and the cathode. The anode of the light emitting element may be electrically connected to a corresponding pixel circuit. However, the present embodiment is not limited thereto.

In some examples, as shown in FIG. 5, the first bezel region B1 of the display substrate may include a fan-out trace region B11, a bending region B12, a first circuit region B13, and a signal access region B14 arranged sequentially in a direction away from the display region AA. The fan-out trace region B11 may be connected to the display region AA, and may at least include a plurality of data lead lines 111, a plurality of drive lead lines 112, a first power supply line, and a second power supply line. The first power supply line may be configured to be connected with a high-potential power supply line of the display region AA, and the second power supply line may be configured to be connected with a low-potential power supply line. The plurality of data lead lines 111 may be electrically connected to the plurality of data lines DL in the display region AA, for example, they may be electrically connected in a one-to-one correspondence. The plurality of data lead lines 111 may extend to the bending region B12 in a fan-out trace manner. The plurality of drive lead lines 112 may extend to the third bezel region B3 and the fourth bezel region B4, and may be electrically connected to drive signal lines 113 in the third bezel region B3 and the fourth bezel region B4. FIG. 5 illustrates two drive signal lines 113 in the third bezel region B3 and two drive signal lines 113 in the fourth bezel region B4 as an example. In the present embodiment, the quantity of drive signal lines is not limited. The plurality of data lead lines 111 may extend to the first circuit region B13 through the bending region B12, and the plurality of drive lead lines 112 may extend to the first circuit region B13 through the bending region B12.

In some examples, as shown in FIG. 5, the bending region B12 is connected between the fan-out trace region B11 and the first circuit region B13, and the bending region B12 may include a composite insulation layer provided with a groove, and the groove may be configured such that the first circuit region B13 and the signal access region B14 bend to the back of the display region AA.

In some examples, as shown in FIG. 5, the first circuit region B13 may at least include a plurality of first electro-static discharge circuits 21. The plurality of first electro-static discharge circuits 21 may be electrically connected to the plurality of data lead lines 111, for example, each data lead line 111 may be electrically connected to one first electro-static discharge circuit 21. The first electro-static discharge circuit 21 may be configured to eliminate static electricity of the data lead line 111 to prevent electrostatic damage to the display substrate. By providing the first electro-static discharge circuit 21 in the first circuit region B13, this example facilitates the reduction of the size of the fan-out trace region B11 in the second direction Y, thereby facilitating the narrow bezel design of the display substrate. However, the present embodiment is not limited thereto. In some other examples, the plurality of first electro-static discharge circuits 21 may be provided in the fan-out trace region B11.

In some examples, as shown in FIG. 5, the first circuit region B13 may further include a plurality of drive chip regions (e.g., four drive chip regions 11*a*, 11*b*, 11*c*, and 11*d*). The drive chip regions are located at a side of the first electro-static discharge circuit 21 away from the bending region B12. The four drive chip regions may be sequentially arranged along the first direction X. Each drive chip region may be provided with a drive chip (IC), the drive chip may be electrically connected to the data line DL of the display region AA through the data lead line 111, the drive chip may be configured to generate a drive signal required for driving the sub-pixel, and to provide the drive signal to the data line DL of the display region AA. For example, the drive signal may be a data signal that drives the sub-pixels to emit light.

In some examples, as shown in FIG. 5, the signal access region B14 is connected to the first circuit region B13, and may include a plurality of bonding pin regions (e.g., four bonding pin regions 12*a*, 12*b*, 12*c*, and 12*d*), and the four bonding pin regions may be sequentially arranged along the first direction X. Each bonding pin region may include a plurality of bonding pins. The plurality of bonding pins may be configured to be bonded and connected to at least one circuit board (e.g., Flexible Printed Circuit, FPC) corresponding thereto. A plurality of bonding pins in a bonding pin region may be correspondingly connected to a drive chip in a drive chip region. For example, a pin provided in the drive chip region may be electrically connected to a bonding pin in a corresponding bonding pin region through a pin connection line.

In some examples, as shown in FIG. 5, the first circuit region B13 may further include a plurality of second electro-static discharge circuits 22. A plurality of second electro-static discharge circuits 22 may be provided on opposite two sides of each drive chip region along the first direction X. The plurality of second electro-static discharge circuits 22 may be electrically connected to the plurality of drive lead lines 112, and the plurality of drive lead lines 112 may extend to the signal access region B14 and be electrically connected to bonding pins of the signal access region B14 to be configured to receive drive signals (including, for example, a start signal, a clock signal, etc.). For example, one drive lead line 112 may be electrically connected to a plurality of second electro-static discharge circuits 22. In some examples, the plurality of drive lead lines may include a start signal lead line that transmits a start signal, a clock signal lead line that transmits a clock signal.

In some examples, as shown in FIG. 5, the output terminal of at least one drive lead line 112 after being connected to the plurality of second electro-static discharge circuits 22 may be electrically connected to an auxiliary resistance trace 25. The provision of the auxiliary resistance trace 25 may play a role to stabilize the voltage of the drive lead line 112.

In some examples, as shown in FIG. 5, the signal access region B14 may also be provided with a first cutting region B5 on a side of the signal access region B14 away from the display region AA. The first cutting region B5 may be provided with a plurality of test pin groups 13 and a plurality of fourth electro-static discharge circuits 24. A fourth electro-static discharge circuit 24 may be located on a side of a test pin group 13 close to the display region AA. Each test pin group 13 may include a plurality of test pins arranged along the first direction X. A test pin may be configured as a pin for signal transmission in a Light-on test phase. The test pin may be electrically connected to the bonding pin in the signal access region B14 through a test transmission trace, and the test transmission trace may also be electrically connected to the fourth electro-static discharge circuit 24. The fourth electro-static discharge circuit 24 may be configured to eliminate static electricity of the test transmission trace.

In some examples, in a process of manufacturing the display substrate, a display mother board may be manufactured first, and then the display mother board may be cut, so that the display mother board is divided into a plurality of display substrates, and a single display substrate may be used to form a single display apparatus. Multiple tests are required during the manufacturing of the display substrate. One important test is Cell Test (CT) Light-on, also known as ET Light-on test. ET light-on detection refers to as that before the display substrate is not bonded to a circuit board, a test signal is input to the display substrate to make its sub-pixels display colors, and a defect detection device checks whether one or more sub-pixels are in good condition to confirm whether there is a defect in the display substrate. The first cutting region B5 in the present example will be cut out in a cutting process after completion of the ET test.

In some examples, as shown in FIG. 5, the third bezel region B3 and the fourth bezel region B4 may each include a second circuit region, a power supply line region, a crack dam region, and a second cutting region arranged sequentially along a direction of the display region AA. The second circuit region may be connected with the display region AA, and may at least include a gate drive circuit 30 which may be electrically connected to a plurality of gate lines GL in the display region AA. The power supply line region is connected to the second circuit region, and may at least include a low-level power supply line. The low-level power supply line may extend along a direction parallel to an edge of the display region, and be connected to a cathode in the display region AA. The crack dam region may be connected to the power supply line region and may at least include a plurality of cracks provided on a composite insulation layer. The second cutting region may be connected to the crack dam region, and may at least include cutting grooves provided on the composite insulation layer. The cutting grooves are configured such that a cutting device cuts along the cutting grooves respectively after manufacturing of all film layers of the display substrate is completed.

In some examples, the first bezel region B1 to the fourth bezel region B4 may be provided with a first isolation dam and a second isolation dam, which may extend in a direction parallel to an edge of the display region to form a ring structure surrounding the display region AA, and the edge of the display region may be an edge at a side of the display region AA close to the first bezel region B1 to the fourth bezel region B4.

In some examples, as shown in FIG. 5, the third bezel region B3 and the fourth bezel region B4 are further provided with a plurality of third electro-static discharge circuits 23. At least one drive signal line 113 may be electrically connected to at least one third electro-static discharge circuit 23. For example, one drive signal line 113 may be electrically connected to two third electro-static discharge circuits 23. The third electro-static discharge circuits 23 to which one drive signal line 113 in the third bezel region B3 is connected may be located in a region of the third bezel region B3 adjacent to the first bezel region B1 and in a region of the third bezel region B3 adjacent to the second bezel region B2. The drive signal line 113 may extend to the first bezel region B1, and may be electrically connected to the drive lead line 112 in the first bezel region B1. For example, a plurality of drive signal lines 113 in the third bezel region B3 and the fourth bezel region B4 may include at least one start signal line and a plurality of clock signal lines. The third electro-static discharge circuit 23 may be configured to eliminate static electricity of the electrically connected drive signal line 113 to prevent electrostatic damage to the display substrate.

Figure 6:
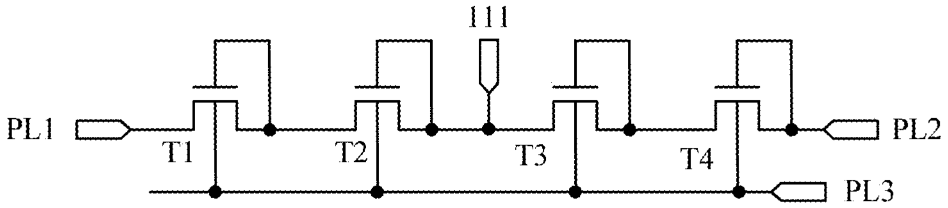
FIG. 6 is a circuit diagram of a first electro-static discharge circuit according to at least one embodiment of the present disclosure.

FIG. 6 is a circuit diagram of a first electro-static discharge circuit according to at least one embodiment of the present disclosure. In some examples, as shown in FIG. 6, the first electro-static discharge circuit may include four oxide thin film transistors connected in series, namely, a first transistor T1, a second transistor T2, a third transistor T3, and a fourth transistor T4. Each of the first transistor T1 to the fourth transistor T4 is an N-type transistor. A first electrode of the first transistor T1 is electrically connected to a first voltage line PL1, a top gate and a second electrode of the first transistor T1 are electrically connected to a first electrode of the second transistor T2, and a bottom gate of the first transistor T1 is electrically connected to a third voltage line PL3. A top gate and a second electrode of the second transistor T2 are electrically connected to a first electrode of the third transistor T3, and a bottom gate of the second transistor T2 is electrically connected to the third voltage line PL3. A top gate and a second electrode of the third transistor T3 are electrically connected to a first electrode of the fourth transistor T4, and a bottom gate of the third transistor T3 is electrically connected to the third voltage line PL3. A top gate and a second electrode of the fourth transistor T4 are electrically connected to the second voltage line PL2. The top gate and the second electrode of the second transistor T2 and the first electrode of the third transistor T3 are electrically connected to a data lead line 111.

Figure 7:
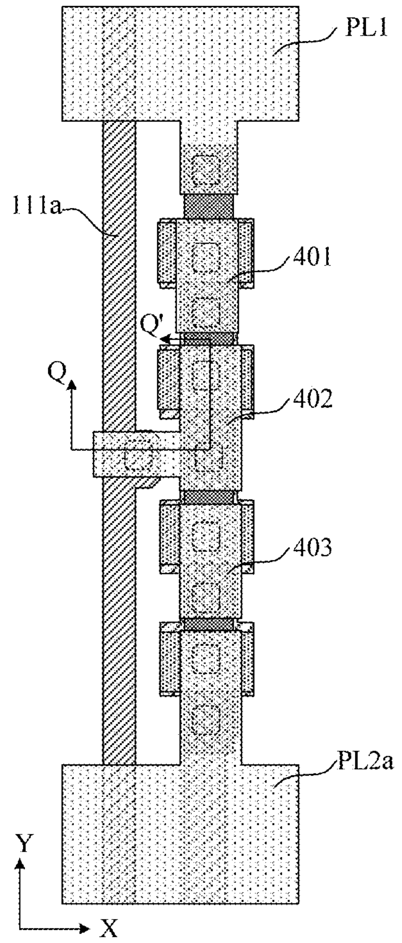
FIG. 7 is a partial top view of a first bezel region according to at least one embodiment of the present disclosure.
Figure 8:
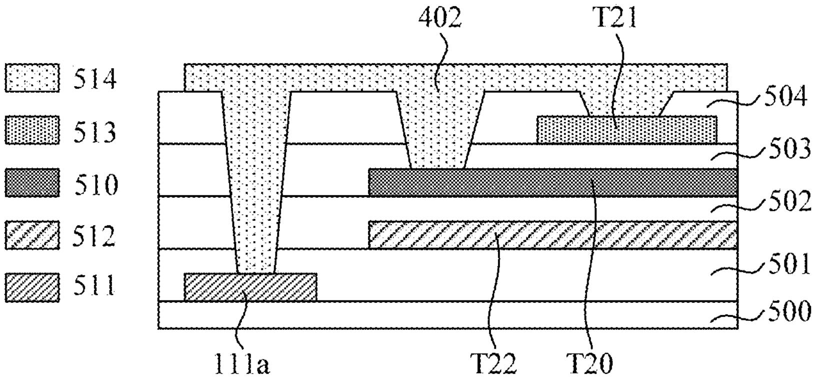
FIG. 8 illustrates schematically a cross-sectional view of a part taken along a direction Q-Q' in FIG. 7.

FIG. 7 is a partial top view of a first bezel region according to at least one embodiment of the present disclosure. FIG. 7 illustrates a schematic plan view of a first electro-static discharge circuit to which a data lead line 111*a* is electrically connected. FIG. 8 illustrates schematically a cross-sectional view of a part taken along a direction Q-Q' in FIG. 7. In some examples, as shown in FIG. 8, in a direction perpendicular to the display substrate, the peripheral region of the display substrate may at least include a base substrate 500, and a first conductive layer 511, a first insulation layer 501, a second conductive layer 512, a second insulation layer 502, a semiconductor layer 510, a third insulation layer 503, a third conductive layer 513, a fourth insulation layer 504, and a fourth conductive layer 514 disposed sequentially on the base substrate 500. The second conductive layer 512 may also be referred to as a first gate metal layer, and the third conductive layer 513 may also be referred to as a second gate metal layer. The second insulation layer 502 and the third insulation layer 503 may also be referred to as a gate insulator layer. For example, each of the first insulation layers 501 to the fourth insulation layers 504 may be inorganic insulation layers. However, the present embodiment is not limited thereto.

In some examples, the pixel circuit of the display region of the display substrate may include only oxide thin film transistors. The film layer structure of the pixel circuit in the display region may be similar to the film layer structure of the circuit of the peripheral region, and a planarization layer, a light emitting structure layer, and an encapsulation structure layer may be sequentially provided on a side of the fourth conductive layer in the display region away from the base substrate. For example, the light emitting structure layer may include an anode layer, a pixel definition layer, an organic light emitting layer, and a cathode. The anode layer may include an anode of the light emitting element, and the anode may be disposed on the planarization layer. The pixel definition layer may be disposed on the anode layer and the planarization layer, and the pixel definition layer is provided with a pixel opening, and the pixel opening exposes at least a portion of a surface of the anode. The organic emitting layer is at least partially disposed within the pixel opening, and is connected with the anode. The cathode is disposed on the organic emitting layer, and is connected with the organic emitting layer. The organic emitting layer emits light of a corresponding color under drive of the anode and the cathode. For example, the encapsulation structure layer may include a first encapsulation layer, a second encapsulation layer, and a third encapsulation layer which are stacked. The first encapsulation layer and the third encapsulation layer may be made of an inorganic material, the second encapsulation layer may be made of an organic material, and the second encapsulation layer is disposed between the first encapsulation layer and the third encapsulation layer, which can ensure that external water vapor cannot enter the light emitting structure layer. However, the present embodiment is not limited thereto. In some other examples, the pixel circuit of the display region may include an oxide thin film transistor(s) and a low temperature poly silicon thin film transistor(s).

In some examples, the organic light emitting layer may at least include a hole injection layer, a hole transport layer, a light emitting layer and a hole block layer which are stacked on the anode. In some examples, the hole injection layers of all sub-pixels may be a common layer connected together; the hole transport layers of all sub-pixels may be a common layer connected together; the light emitting layers of close to sub-pixels may be slightly overlapped or isolated; and the hole block layers may be a common layer connected together. However, the present embodiment is not limited thereto.

Figure 9A:
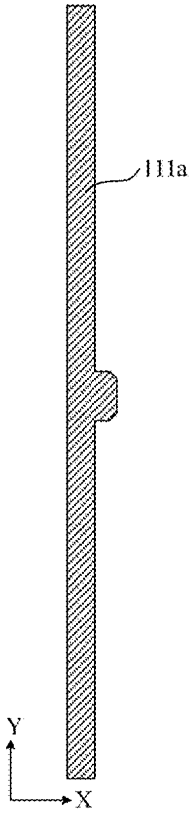
FIG. 9A is a schematic plan view of a first bezel region after a first conductive layer is formed in FIG. 7.
Figure 9B:
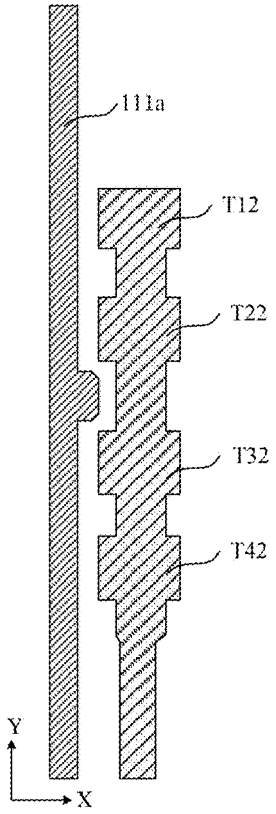
FIG. 9B is a schematic plan view of a first bezel region after a second conductive layer is formed in FIG. 7.
Figure 9C:
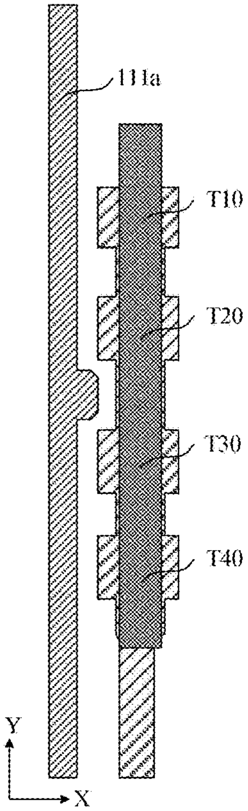
FIG. 9C is a schematic plan view of a first bezel region after a semiconductor layer is formed in FIG. 7.
Figure 9D:
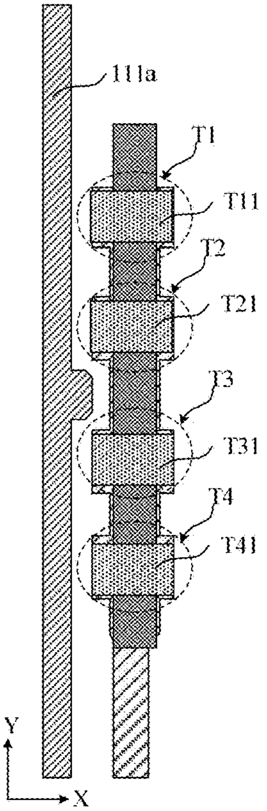
FIG. 9D is a schematic plan view of a first bezel region after a third conductive layer is formed in FIG. 7.
Figure 9E:
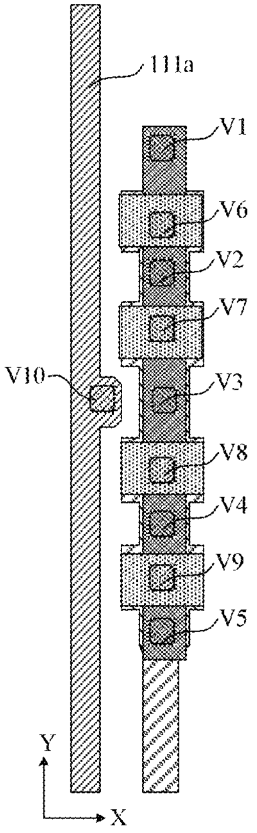
FIG. 9E is a schematic plan view of a first bezel region after a fourth insulation layer is formed in FIG. 7.

FIG. 9A is a schematic plan view of a first bezel region after a first conductive layer is formed in FIG. 7. FIG. 9B is a schematic plan view of a first bezel region after a second conductive layer is formed in FIG. 7. FIG. 9C is a schematic plan diagram of a first bezel region after a semiconductor layer is formed in FIG. 7. FIG. 9D is a schematic plan view of a first bezel region after a third conductive layer is formed in FIG. 7. FIG. 9E is a schematic plan view of a first bezel region after a fourth insulation layer is formed in FIG. 7.

In some examples, as shown in FIG. 9A, the first conductive layer of the first bezel region may include a data lead line 111*a*. The data lead line 111*a* may extend at least in the second direction Y. As shown in FIG. 9B, the second conductive layer of the first bezel region may include bottom gates of a plurality of oxide thin film transistors of the first electro-static discharge circuit, for example, including a bottom gate T12 of the first transistor, a bottom gate T22 of the second transistor, a bottom gate T32 of the third transistor, and a bottom gate T42 of the fourth transistor. The bottom gate T12 of the first transistor, the bottom gate T22 of the second transistor, the bottom gate T32 of the third transistor, and the bottom gate T42 of the fourth transistor may be of an integral structure, and are sequentially arranged along the second direction Y, and are adjacent to the data lead line 111*a* in the first direction X. Orthographic projections of the bottom gates of the plurality of oxide thin film transistors of the first electro-static discharge circuit on the base substrate and an orthographic projection of the data lead line 111*a* on the base substrate do not overlap.

In some examples, as illustrated in FIG. 9C, the semiconductor layer of the first bezel region may include active layers of a plurality of oxide thin film transistors of the first electro-static discharge circuit, for example, including an active layer T10 of the first transistor, an active layer T20 of the second transistor, an active layer T30 of the third transistor, and an active layer T40 of the fourth transistor. The active layer T10 of the first transistor, the active layer T20 of the second transistor, the active layer T30 of the third transistor, and the active layer T40 of the fourth transistor may be of an integral structure, and may be arranged sequentially along the second direction Y. For example, the integral structure may be a strip structure extending in the second direction Y. An orthographic projection of the active layer T10 of the first transistor on the base substrate is partially overlapped with an orthographic projection of the bottom gate T12 on the base substrate. An orthographic projection of the active layer T20 of the second transistor on the base substrate is at least partially overlapped with an orthographic projection of the bottom gate T22 on the base substrate, for example, the orthographic projection of the active layer T20 of the second transistor on the base substrate may be within a range of the orthographic projection of the bottom gate T22 on the base substrate. An orthographic projection of the active layer T30 of the third transistor on the base substrate is at least partially overlapped with an orthographic projection of the bottom gate T32 on the base substrate, for example, the orthographic projection of the active layer T30 of the third transistor on the base substrate may be within a range of the orthographic projection of the bottom gate T32 on the base substrate. An orthographic projection of the active layer T40 of the fourth transistor on the base substrate may be at least partially overlapped with an orthographic projection of the bottom gate T42 on the base substrate.

In some examples, as illustrated in FIG. 9D, the third conductive layer of the first bezel region may include top gates of a plurality of oxide thin film transistors of the first electro-static discharge circuit, for example, including a top gate T11 of the first transistor T1, a top gate T21 of the second transistor T2, a top gate T31 of the third transistor T3, and a top gate T41 of the fourth transistor T4. Orthographic projections of the top gate T11 of the first transistor T1, the top gate T21 of the second transistor T2, the top gate T31 of the third transistor T3, and the top gate T41 of the fourth transistor T4 on the base substrate may, for example, all be rectangles of the same size. The top gate T11 of the first transistor T1, the top gate T21 of the second transistor T2, the top gate T31 of the third transistor T3, and the top gate T41 of the fourth transistor T4 may be arranged sequentially in the second direction Y. The orthographic projection of the top gate T11 of the first transistor T1 on the base substrate may be located within a range of the orthographic projection of the bottom gate T12 on the base substrate; the orthographic projection of the top gate T21 of the second transistor T2 on the base substrate may be located within a range of an orthographic projection of the bottom gate T22 on the base substrate; the orthographic projection of the top gate T31 of the third transistor T3 on the base substrate may be located within a range of the orthographic projection of the bottom gate T32 on the base substrate; the orthographic projection of the top gate T41 of the fourth transistor T4 on the base substrate may be located within a range of the orthographic projection of the bottom gate T42 on the base substrate. The bottom gates of the oxide thin film transistors according to the present example can shield the overlapping regions of the active layers and the top gates, which plays a role of light shading the channel region, and is beneficial to ensuring the performance of the oxide thin film transistor.

In some examples as shown in FIG. 9E, the fourth insulation layer of the first bezel region is provided with a plurality of vias, which may include, for example, a first via V1 to a tenth via V10. The fourth insulation layer and the third insulation layer within the first via V1 to the fifth via V5 may be removed, exposing at least a portion of a surface of the semiconductor layer. The fourth insulation layer in the sixth V6 to the ninth via to V9 may be removed, exposing at least a portion of a surface of the third conductive layer. The fourth insulation layer, the third insulation layer, the second insulation layer, and the first insulation layer in the tenth via V10 may be removed, exposing at least a portion of a surface of the first conductive layer.

In some examples, as shown in FIG. 7, the fourth conductive layer of the first bezel region may include a first voltage line PL1, a second voltage line (e.g., a second voltage line PL2a), and a plurality of connection electrodes (e.g., a first connection electrode 401 to a third connection electrode 403). The first voltage line PL1 may be electrically connected to one end of the active layer T10 of the first transistor T1 through the first via V1. The first connection electrode 401 may be electrically connected to the top gate T41 of the first transistor T1 through the sixth via V6, and may also be electrically connected to connection ends of the active layer T10 of the first transistor T1 and the active layer T20 of the second transistor T2 through the second via V2. The second connection electrode 402 may be electrically connected to the top gate T21 of the second transistor T2 through the seventh via V7, may also be electrically connected to connection ends of the active layer T20 of the second transistor T2 and the active layer T30 of the third transistor T3 through the third via V3, and may also be electrically connected to the data lead line 111a through the tenth via V10. The third connection electrode 403 may be electrically connected to the top gate T31 of the third transistor T3 through the eighth via V8, and may also be electrically connected to connection ends of the active layer T30 of the third transistor T3 and the active layer T40 of the fourth transistor T4 through the fourth via V4. The second voltage line PL2a may be electrically connected to the top gate T41 of the fourth transistor T4 through the ninth via V9, and may also be electrically connected to one terminal of the fourth active layer T40 through the fifth via V5.

Figure 10A:
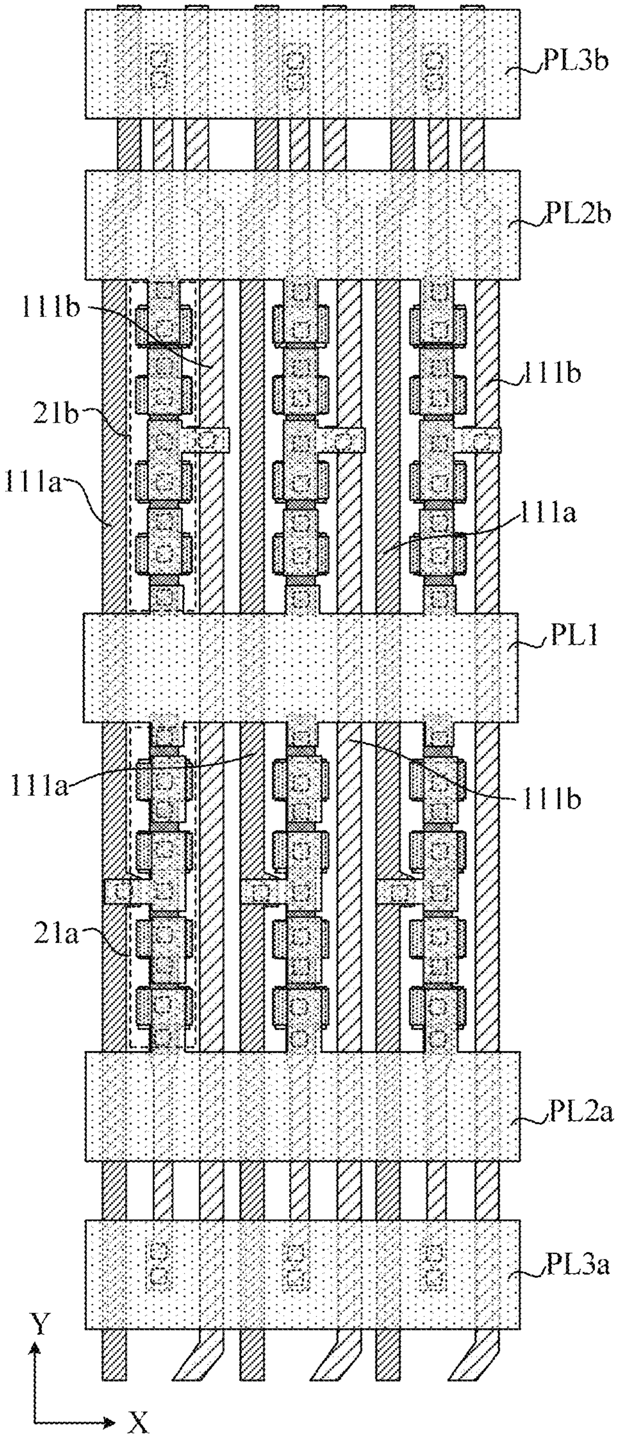
FIG. 10A is another partial top view of a first bezel region according to at least one embodiment of the present disclosure.
Figure 10B:
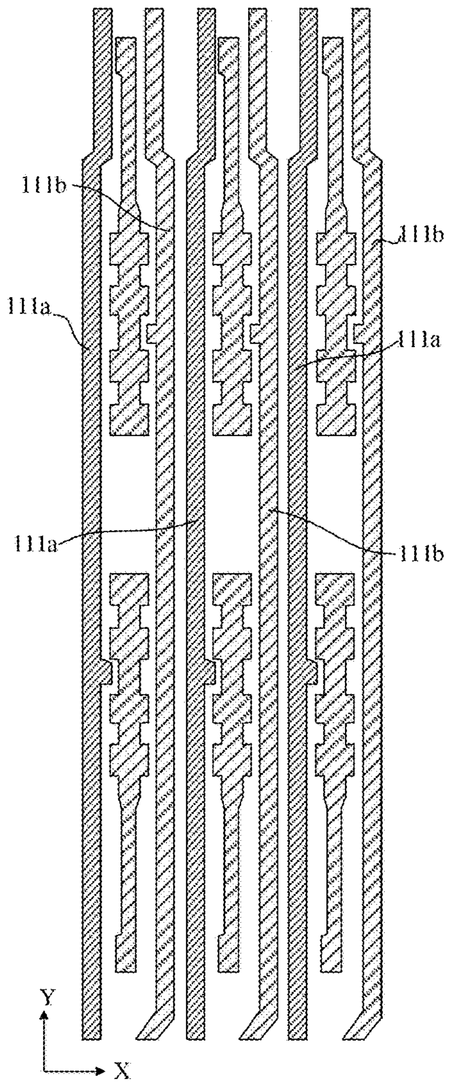
FIG. 10B is a schematic plan view of a first bezel region after a second conductive layer is formed in FIG. 10A.
Figure 10C:
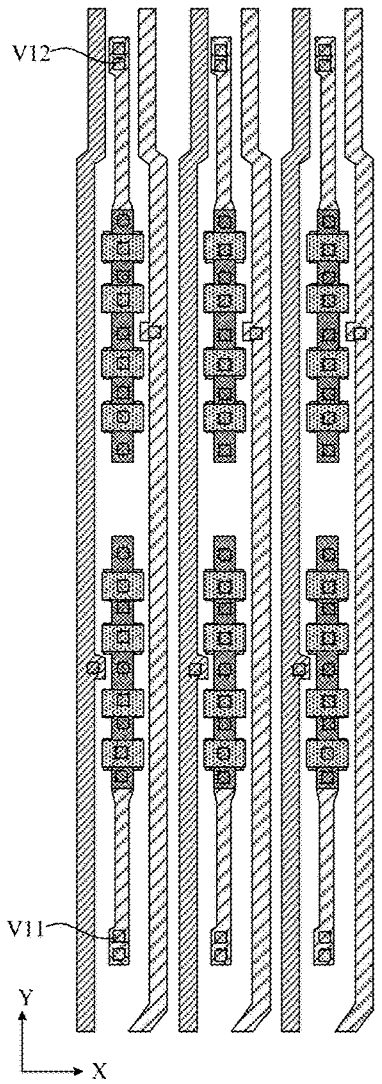
FIG. 10C is a schematic plan view of a first bezel region after a fourth insulation layer is formed in FIG. 10A.

FIG. 10A is another partial top view of a first bezel region according to at least one embodiment of the present disclosure. FIG. 10A illustrates six data lead lines and six first electro-static discharge circuits electrically connected to the six data lead lines in one-to-one correspondence. FIG. 10B is a schematic plan view of a first bezel region after a second conductive layer is formed in FIG. 10A. FIG. 10C is a schematic plan view of a first bezel region after a fourth insulation layer is formed in FIG. 10A.

In some examples, as shown in FIGS. 10A-10C, the plurality of data lead lines 111 of the first bezel region may include a plurality of groups of data lead lines. The plurality of groups of data lead lines may be sequentially arranged along the first direction X. At least one group of data lead lines may include two adjacent data lead lines 111a and 111b disposed in different layers. For example, the data lead line 111a may be located in the first conductive layer, and the data lead line 111b may be located in the second conductive layer, that is, in a same layer as the bottom gate of the oxide thin film transistor of the first electro-static discharge circuit. Orthographic projections of the data lead line 111a and the data lead line 111b within a group on the base substrate may not overlap. The data lead line 111a and the data lead line 111b may extend at least in the second direction Y. The first electro-static discharge circuit 21a to which the data lead line 111a is electrically connected and the first electro-static discharge circuit 21b to which the data lead line 111b within a same group is electrically connected may be located between the data lead lines 111a and 111b and arranged in the second direction Y. The first electro-static discharge circuit 21a to which the data lead line 111a is electrically connected may be located at a side of the first electro-static discharge circuit 21b, to which the data lead line 111b is electrically connected, away from the display region. No first electro-static discharge circuit is provided between adjacent groups of data lead lines. In other words, a first electro-static discharge circuit 21a electrically connected to a data lead line 111a and a first electro-static discharge circuit 21b electrically connected to an adjacent data lead line 111b at a side of the data lead line 111a in the first direction X may be provided between the data lead line 111a and the data lead line 111b, and no first electrostatic discharge circuit is provided between the data lead line 111a and an adjacent data lead line 111b at the other side of the data lead line 111a in the first direction X, and they may be directly adjacent.

In some examples, as shown in FIGS. 10A to 10C, the fourth insulation layer of the first bezel region may be further provided with a plurality of eleventh vias V11 and a plurality of twelfth vias V12. An integral structure formed by the bottom gates of the four oxide thin film transistors of the first electro-static discharge circuit 21a may be electrically connected to one third voltage line PL3a through two eleventh vias V11 disposed vertically. An integral structure formed by the bottom gates of the four oxide thin film transistors of the first electro-static discharge circuit 21b may be electrically connected to another third voltage line PL3b through two twelfth vias V12 disposed vertically. A film layer structure of the first electro-static discharge circuit 21a and the second electro-static discharge circuit 21b may be shown with reference to FIGS. 7 to 9E, and thus the description thereof will not be repeated here.

In some examples, as shown in FIG. 10A, the first voltage lines PL1, the second voltage lines PL2a and PL2b, and the third voltage lines PL3*a* and PL3*b* may be located in the fourth conductive layer. The first voltage lines PL1, the second voltage lines PL2*a* and PL2*b*, and the third voltage lines PL3*a* and PL3*b* may extend along at least the first direction X. The first electro-static discharge circuits 21*a* and 21*b* are electrically connected to a same first voltage line PL1, the second voltage line PL2*a* to which the first electro-static discharge circuit 21*a* is electrically connected may be located at a side of the first voltage line PL1 away from the display region, and the third voltage line PL3*a* to which the first electro-static discharge circuit 21*a* is electrically connected may be located at a side of the second voltage line PL2*a* away from the first voltage line PL1. The second voltage line PL2*b* to which the first electro-static discharge circuit 21*b* is electrically connected may be located at a side of the first voltage line PL1 close to the display region, and the third voltage line PL3*b* to which the first electro-static discharge circuit 21*b* is electrically connected may be located at a side of the second voltage line PL2*b* close to the display region. The first electro-static discharge circuit 21*a* to which the data lead line 111*a* is electrically connected and the first electro-static discharge circuit 21*b* to which the data lead line 111*b* within a same group is electrically connected may be provided symmetrically with respect to the first voltage line PL1.

The provision and arrangement of the first electro-static discharge circuits according to the present example is conducive to saving occupied space and is conducive to achieving the narrow bezel design of the display substrate. A plurality of data lead lines are arranged at different conductive layers at intervals, which can be conducive to reducing the spacing between adjacent data lead lines and reducing signal interference between adjacent data lead lines. However, the present embodiment is not limited thereto. In some other examples, the plurality of data lead lines may be disposed in the same layer, for example, all located in the first conductive layer or the second conductive layer.

Figure 11:
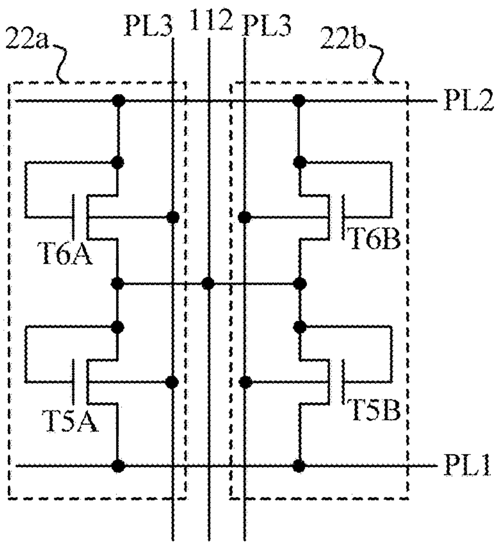
FIG. 11 is a circuit diagram of a second electro-static discharge circuit electrically connected with a drive lead line according to at least one embodiment of the present disclosure.

FIG. 11 is a circuit diagram of a second electro-static discharge circuit electrically connected with a drive lead line according to at least one embodiment of the present disclosure. In some examples, as shown in FIG. 11, one drive lead line 112 may be electrically connected to two second electro-static discharge circuits 22*a* and 22*b*. The second electro-static discharge circuit 22*a* may include a fifth transistor T5A and a sixth transistor T6A, and the second electro-static discharge circuit 22*b* may include a fifth transistor T5B and a sixth transistor T6B. A first electrode of the fifth transistor T5A is electrically connected to the first voltage line PL1, a top gate and a second electrode of the fifth transistor T5A are electrically connected to a first electrode of the sixth transistor T6A, and a top gate and a second electrode of the sixth transistor T6A are electrically connected to the second voltage line PL2. A first electrode of the fifth transistor T5B is electrically connected to the first voltage line PL1, a top gate and a second electrode of the fifth transistor T5B are electrically connected to a first electrode of the sixth transistor T6B, and a top gate and a second electrode of the sixth transistor T6B are electrically connected to the second voltage line PL2. The drive lead line 112 is electrically connected to the top gate and the second electrode of the fifth transistor T5A, the first electrode of the sixth transistor T6A, the top gate and the second electrode of the fifth transistor T5B, and the first electrode of the sixth transistor T6B. The bottom gates of the fifth transistors T5A and T5B and the bottom gates of the sixth transistors T6A and T6B are all electrically connected to the third voltage line PL3.

Figure 12A:
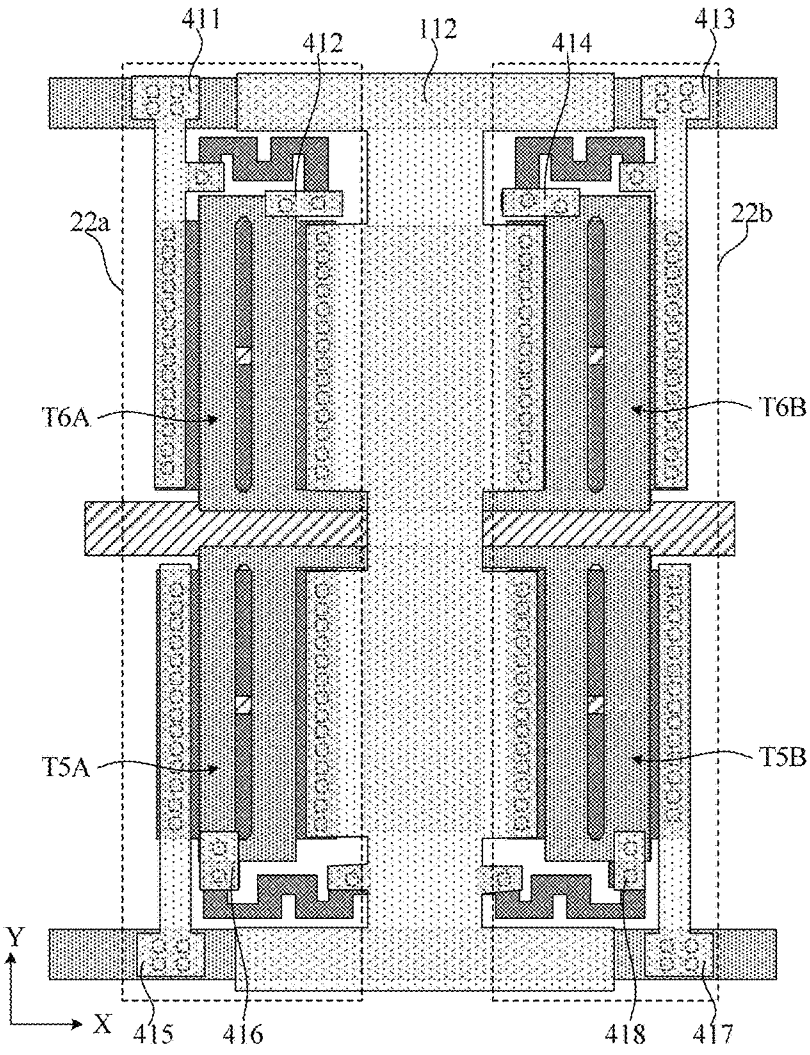
FIG. 12A is another partial top view of a first bezel region according to at least one embodiment of the present disclosure.
Figure 12B:
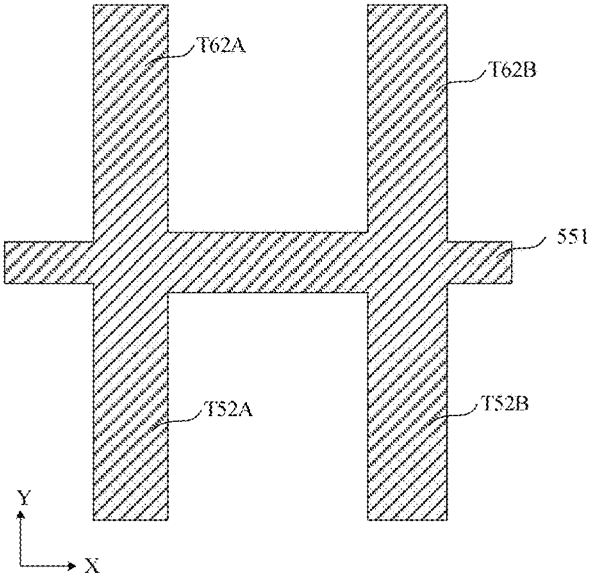
FIG. 12B is a schematic plan view of a first bezel region after a second conductive layer is formed in FIG. 12A.
Figure 12C:
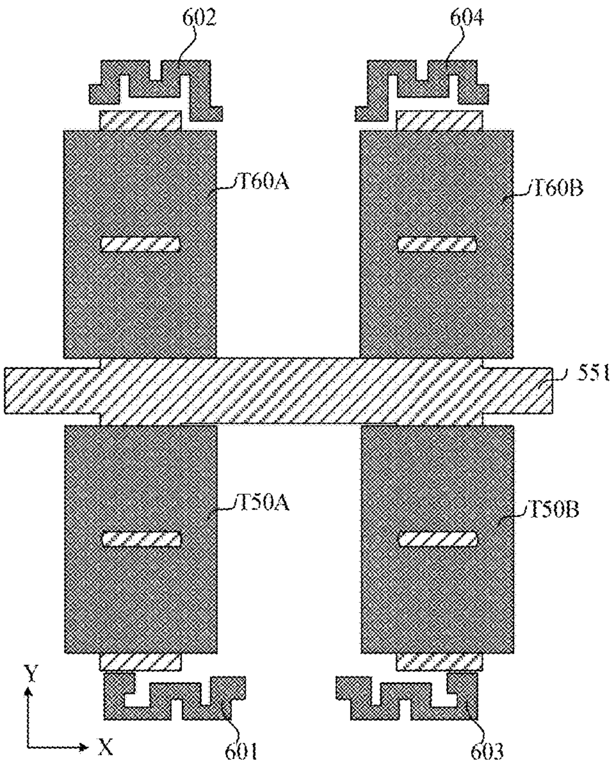
FIG. 12C is a schematic plan view of a first bezel region after a semiconductor layer is formed in FIG. 12A.
Figure 12D:
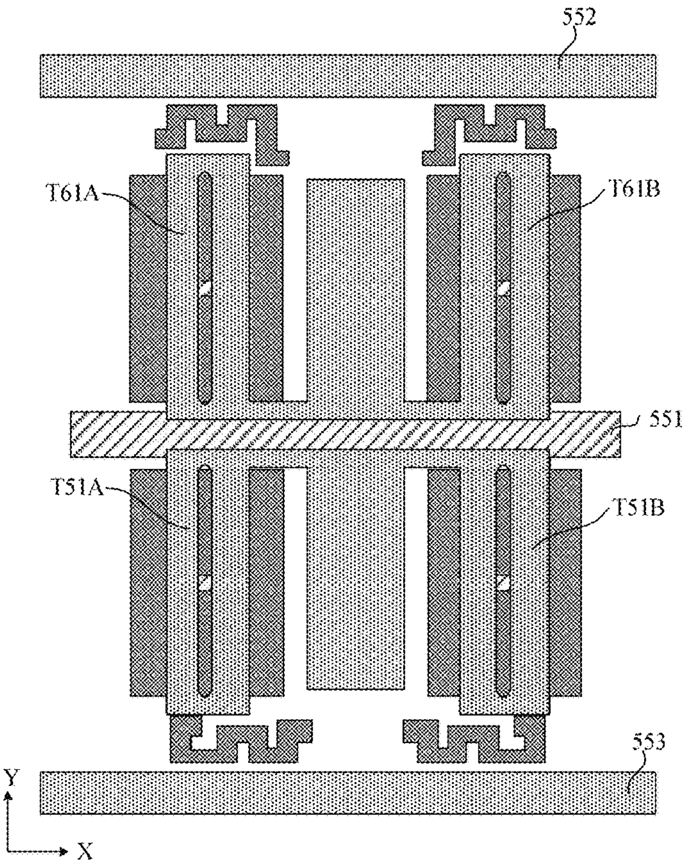
FIG. 12D is a schematic plan view of a first bezel region after a third conductive layer is formed in FIG. 12A.
Figure 12E:
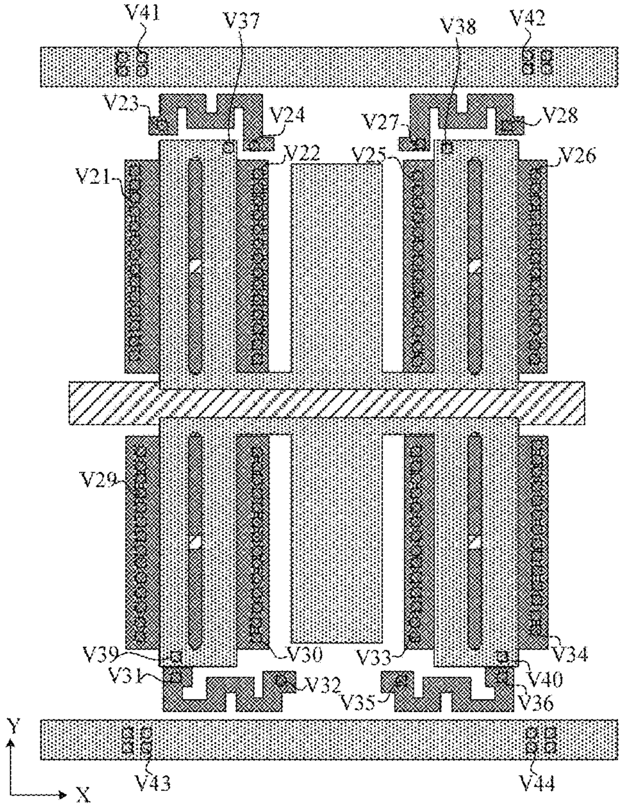
FIG. 12E is a schematic plan view of a first bezel region after a fourth insulation layer is formed in FIG. 12A.

FIG. 12A is another partial top view of a first bezel region according to at least one embodiment of the present disclosure. FIG. 12A illustrates a drive lead line and two second electro-static discharge circuits electrically connected with the drive lead line. FIG. 12B is a schematic plan view of a first bezel region after a second conductive layer is formed in FIG. 12A. FIG. 12C is a schematic plan view of a first bezel region after a semiconductor layer is formed in FIG. 12A. FIG. 12D is a schematic plan view of a first bezel region after a third conductive layer is formed in FIG. 12A. FIG. 12E is a schematic plan view of a first bezel region after a fourth insulation layer is formed in FIG. 12A.

In some examples, as shown in FIG. 12A, two second electro-static discharge circuits 22*a* and 22*b* to which the drive signal line 112 is electrically connected may be arranged along the first direction X, and may be disposed symmetrically with respect to the drive signal line 112.

In some examples, as shown in FIG. 12B, the second conductive layer of the first bezel region may include bottom gates of oxide thin film transistors of the second electro-static discharge circuit (for example, including a bottom gate T52A of the fifth transistor and a bottom gate T62A of the sixth transistor of the second electro-static discharge circuit 22*a*, a bottom gate T52B of the fifth transistor and a bottom gate T62B of the sixth transistor of the second electro-static discharge circuit 22*b*), and a first connection line 551. The bottom gate T52A of the fifth transistor and the bottom gate T62A of the sixth transistor of the second electro-static discharge circuit 22*a*, the bottom gate T52B of the fifth transistor and the bottom gate T62B of the sixth transistor of the second electro-static discharge circuit 22*b*, and the first connection line 551 may be of an integral structure. The first connection line 551 may extend at least along the first direction X, and may be electrically connected to the third voltage line located in the fourth conductive layer. The bottom gate T52A of the fifth transistor and the bottom gate T62A of the sixth transistor of the second electro-static discharge circuit 22*a* may be disposed symmetrically with respect to the first connection line 551, and the bottom gate T52B of the fifth transistor and the bottom gate T62B of the sixth transistor of the second electro-static discharge circuit 22*b* may be disposed symmetrically with respect to the first connection line 551.

In some examples, as shown in FIG. 12C, the semiconductor layer of the first bezel region may include active layers of oxide thin film transistors of the second electro-static discharge circuits (for example, including an active layer T50A of the fifth transistor and an active layer T60A of the sixth transistor of the second electro-static discharge circuit 22*a*, an active layer T50B of the fifth transistor and an active layer T60B of the sixth transistor of the second electro-static discharge circuit 22*b*), and a plurality of oxide connection blocks (for example, including a first oxide connection block 601 to a fourth oxide connection block 604). The active layer T50A of the fifth transistor and the active layer T60A of the sixth transistor of the second electro-static discharge circuit 22*a* may be disposed symmetrically with respect to the first connection line 551, and the active layer T50B of the fifth transistor and the active layer T60B of the sixth transistor of the second electro-static discharge circuit 22*b* may be disposed symmetrically with respect to the first connection line 551. Taking the active layer T50A of the fifth transistor of the second electro-static discharge circuit 22*a* as an example, the active layer T50A may be substantially rectangular, and have a strip-shaped groove extending, for example, along the first direction X, and an orthographic projection of the strip-shaped groove on the base substrate may be overlapped with an orthographic projection of the bottom gate T52A on the base substrate, for example, may be located within a range of the orthographic projection of the bottom gate T52A on the base substrate. By providing a strip-shaped groove in the active layer in this example, the width of the active layer can be reduced (e.g., so that the length of the active layer along the second direction Y can be less than 50 microns), and the occurrence of a burn due to an excessive width of the active layer, which affects the performance of the transistor, can be avoided.

In some examples, as shown in FIG. 12C, the first oxide connection block 601 may be located at a side of the active layer T50A of the fifth transistor away from the active layer T60A of the sixth transistor, and the second oxide connection block 602 may be located at a side of the active layer T60A of the sixth transistor away from the active layer T50A of the fifth transistor. The third oxide connection block 603 may be located at a side of the active layer T50B of the fifth transistor away from the active layer T60B of the sixth transistor, and the fourth oxide connection block 604 may be located at a side of the active layer T60B of the sixth transistor away from the active layer T50B of the fifth transistor. Orthographic projections of the first oxide connection block 601 to the fourth oxide connection block 604 on the base substrate may all be serpentine traces. By providing oxide connection blocks of serpentine traces, it is beneficial to increase the resistances of the oxide connection blocks.

In some examples, as shown in FIG. 12D, the third conductive layer of the first bezel region may further include top gates of the oxide thin film transistors of the second electro-static discharge circuits (for example, including a top gate T51A of the fifth transistor and a top gate T61A of the sixth transistor of the second electro-static discharge circuit 22*a*, a top gate T51B of the fifth transistor and a top gate T61B of the sixth transistor of the second electro-static discharge circuit 22*b*), a second connection line 552, and a third connection line 553. The top gate T51A of the fifth transistor of the second electro-static discharge circuit 22*a* and the top gate T51B of the fifth transistor of the second electro-static discharge circuit 22*b* may be of an integral structure, and an orthographic projection of the integral structure on the base substrate may be roughly in a shape of a Chinese character "¦|┌", thereby preventing burns from occurring in the second electro-static discharge circuit due to excessive concentration of the current. The top gate T61A of the sixth transistor of the second electro-static discharge circuit 22*a* and the top gate T61B of the sixth transistor of the second electro-static discharge circuit 22*b* may be of an integral structure. The integral structure of the top gate T51A of the fifth transistor of the second electro-static discharge circuit 22*a* and the top gate T51B of the fifth transistor of the second electro-static discharge circuit 22*b*, and the integral structure of the top gate T61A of the sixth transistor of the second electro-static discharge circuit 22*a* and the top gate T61B of the sixth transistor of the second electro-static discharge circuit 22*b* may be provided symmetrically with respect to the first connection line 551. The top gates T51A, T51B, T61A, and T61B according to the present example may adopt a double gate structure, thereby beneficial to improving the stability of the oxide thin film transistors.

In some examples, as shown in FIG. 12D, the second connection line 552 and the third connection line 553 may extend along at least the first direction X, the second connection line 552 may be located at a side of the second electro-static discharge circuits 22*a* and 22*b* close to the display region, and the third connection line 553 may be located at a side of the second electro-static discharge circuits 22*a* and 22*b* away from the display region. The second connection line 552 may be electrically connected to the second voltage line located in the fourth conductive layer, and the third connection line 553 may be electrically connected to the third voltage line located in the fourth conductive layer.

In some examples, as shown in FIG. 12E, the fourth insulation layer of the first bezel region may be further provided with a plurality of vias, which include, for example, a twenty-first via V21 to a forty-fourth via V44. The fourth insulation layer and the third insulation layer within the twenty-first via V21 to the thirty-sixth via V36 may be removed, exposing at least a portion of a surface of the semiconductor layer. The fourth insulation layer in the thirty-seventh via V37 to the forty-fourth via V44 may be removed, exposing at least a portion of a surface of the third conductive layer.

In some examples, as shown in FIGS. 12A to 12E, the fourth conductive layer of the first bezel region may include a drive lead line 112, and a plurality of connection electrodes (e.g., an eleventh connection electrode 411 to an eighteenth connection electrode 418). The eleventh connection electrode 411 may be electrically connected to one end of the active layer T60A of the sixth transistor T6A through a plurality of twenty-first vias V21, may also be electrically connected to the first oxide connection block 601 through at least one twenty-third via V23, and may also be electrically connected to the second connection line 552 through a plurality of forty-first vias V41. The twelfth connection electrode 412 may be electrically connected to the top gate T61A of the sixth transistor T6A through the thirty-seventh via V37, and may also be electrically connected to the first oxide connection block 601 through the twenty-fourth via V24. The thirteenth connection electrode 413 may be electrically connected to one end of the active layer T60B of the sixth transistor T6B through a plurality of twenty-sixth vias V26, may also be electrically connected to the third oxide connection block 603 through at least one twenty-eighth via V28, and may also be electrically connected to the second connection line 552 through a plurality of forty-second vias V42. The fourteenth connection electrode 414 may be electrically connected to the top gate T61B of the sixth transistor T6B through the thirty-eighth via V38, and may also be electrically connected to the third oxide connection block 603 through the twenty-seventh via V27. The fifteenth connection electrode 415 may be electrically connected to one end of the active layer T50A of the fifth transistor T5A through a plurality of twenty-ninth vias V29 disposed vertically, and may also be electrically connected to the third connection line 553 through a plurality of forty-third vias V43. The sixteenth connection electrode 416 may be electrically connected to the second oxide connection block 602 through the thirty-first via V31, and may also be electrically connected to the top gate T51A of the fifth transistor T5A through the thirty-ninth via V39. The seventeenth connection electrode 417 may be electrically connected to one end of the active layer T50B of the fifth transistor T5B through a plurality of thirty-fourth vias V34 disposed vertically, and may also be electrically connected to the third connection line 553 through a plurality of forty-fourth vias V44. The eighteenth connection electrode 418 may be electrically connected to the fourth oxide connection block 604 through the thirty-sixth via V36, and may also be electrically connected to the top gate T51B of the fifth transistor T5B through the fortieth via V40.

In some examples, as shown in FIGS. 12A to 12E, the drive lead line 112 may be electrically connected to the other end of the active layer T60A of the sixth transistor T6A through a plurality of twenty-second vias V22 disposed vertically, may also be electrically connected to the other end of the active layer T60B of the sixth transistor T6B through a plurality of twenty-fifth vias V25 disposed vertically, may also be electrically connected to the other end of the active layer T50A of the fifth transistor T5A through a plurality of thirty vias V30 disposed vertically, may also be electrically connected to the other end of the active layer T50B of the fifth transistor T5B through a plurality of thirty-third vias V33 disposed vertically, may also be electrically connected to the first oxide connection block 601 through a thirty-second via V32, and may also be electrically connected to the third oxide connection block 603 through a thirty-fifth via V35. In the present example, "disposed vertically" refers to the arrangement along the second direction Y, and "disposed horizontally" refers to the arrangement along the first direction X.

In this example, the electrical connection of the fifth transistor T5A to the drive lead line 112 is realized by the first oxide connection block 601, the electrical connection of the fifth transistor T5B to the drive lead line 112 is realized by the third oxide connection block 603, the electrical connection of the sixth transistor T6A to the second voltage line PL2 is realized by the second oxide connection block 602, and the electrical connection of the sixth transistor T6B to the second voltage line PL2 is realized by the fourth oxide connection block 604. By using the oxide connection blocks, the resistances of the connection paths can be increased, so that the components in the second electro-static discharge circuits can be protected from electro-static discharge in the second electro-static discharge circuits.

Figure 13:
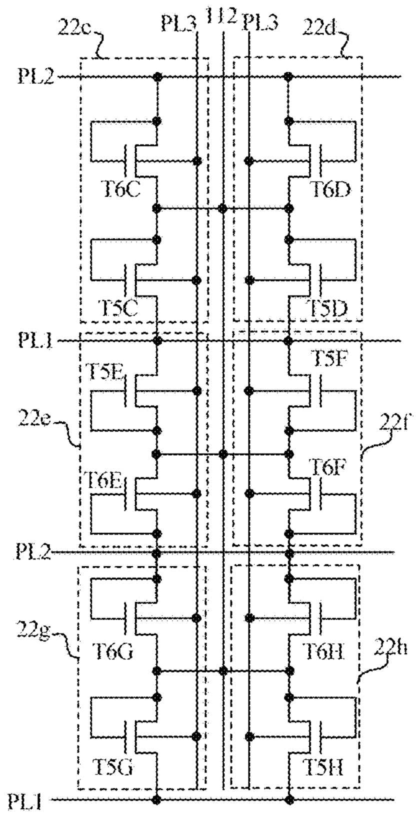
FIG. 13 is another circuit diagram of a second electro-static discharge circuit electrically connected with a drive lead line according to at least one embodiment of the present disclosure.

FIG. 13 is another circuit diagram of a second electro-static discharge circuit electrically connected with a drive lead line according to at least one embodiment of the present disclosure. In some examples, as shown in FIG. 13, one drive lead line 112 may be electrically connected to six second electro-static discharge circuits 22*c*, 22*d*, 22*e*, 22*f*, 22*g*, and 22*h*. The second electro-static discharge circuit 22*c* may include a fifth transistor T5C and a sixth transistor T6C, a top gate and a second electrode of the fifth transistor T5C are electrically connected to a first electrode of the sixth transistor T6C and the drive lead line 112, a first electrode of the fifth transistor T5C is electrically connected to the first voltage line PL1, and a top gate and a second electrode of the sixth transistor T6C are electrically connected to the second voltage line PL2. Bottom gates of the fifth transistor T5C and the sixth transistor T6C are electrically connected to the third voltage line PL3. The second electro-static discharge circuit 22*d* may include a fifth transistor T5D and a sixth transistor T6D; the second electro-static discharge circuit 22*e* may include a fifth transistor T5E and a sixth transistor T6E; the second electro-static discharge circuit 22*f* may include a fifth transistor T5F and a sixth transistor T6F; the second electro-static discharge circuit 22*g* may include a fifth transistor T5G and a sixth transistor T6G; the second electro-static discharge circuit 22*h* may include a fifth transistor T5H and a sixth transistor T6H. The circuit structure of the second electro-static discharge circuits 22*d*, 22*e*, 22*f*, 22*g*, and 22*h* is the same as that of the second electro-static discharge circuit 22*c*, and therefore will not be repeated herein.

Figure 14A:
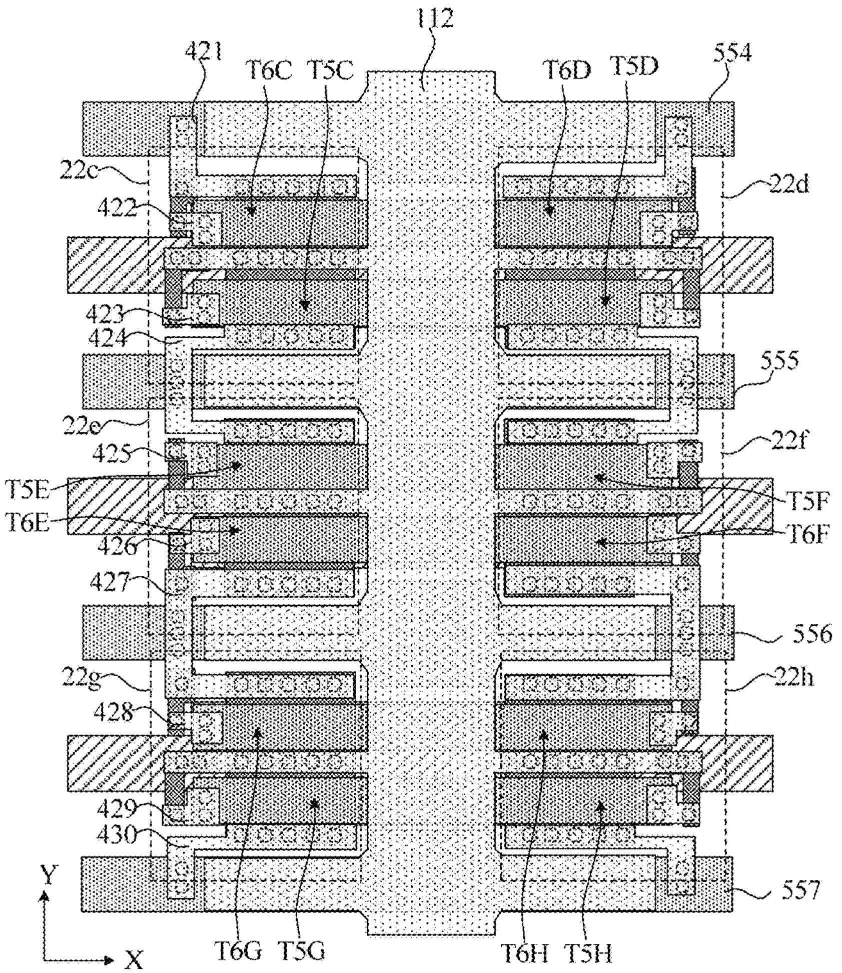
FIG. 14A is another partial top view of a first bezel region according to at least one embodiment of the present disclosure.
Figure 14B:
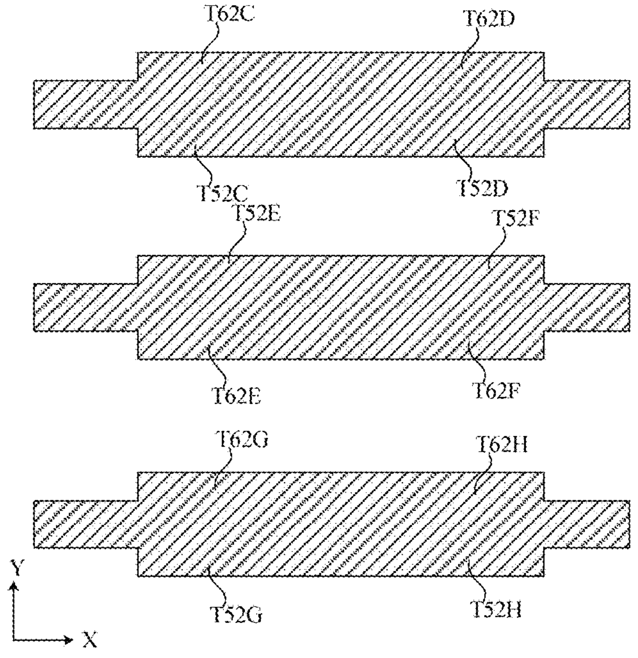
FIG. 14B is a schematic plan view of a first bezel region after a second conductive layer is formed in FIG. 14A.
Figure 14C:
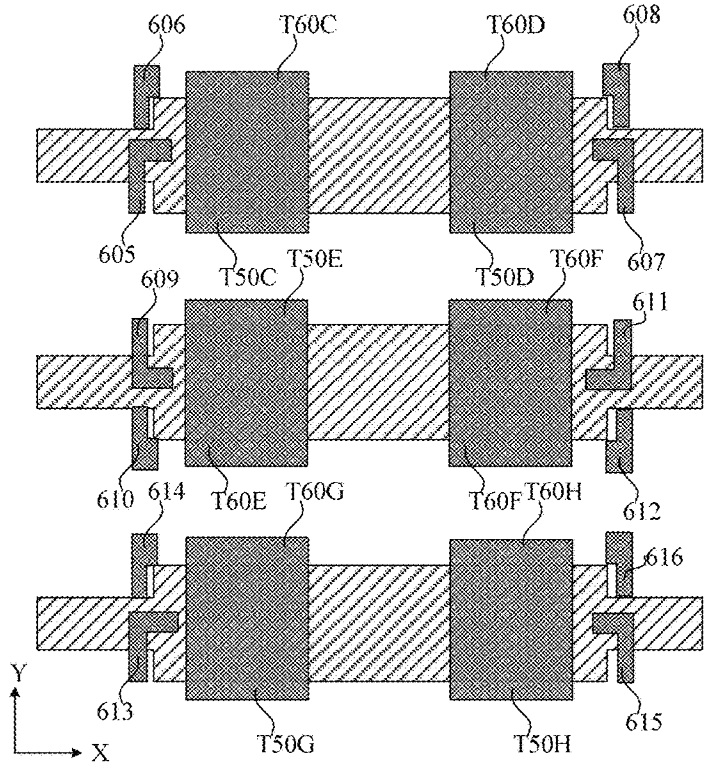
FIG. 14C is a schematic plan view of a first bezel region after a semiconductor layer is formed in FIG. 14A.
Figure 14D:
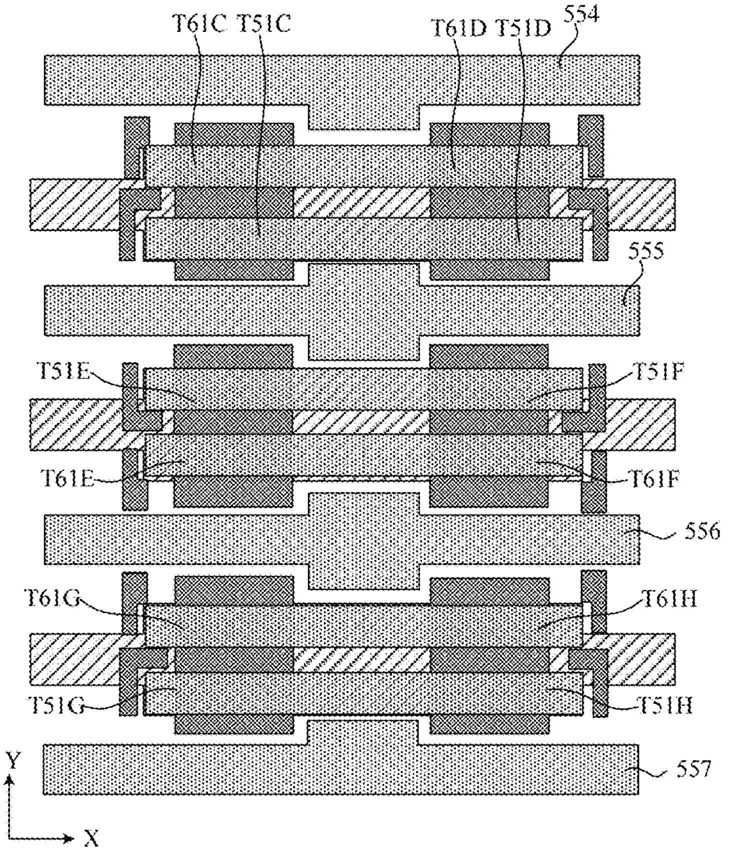
FIG. 14D is a schematic plan view of a first bezel region after a third conductive layer is formed in FIG. 14A.
Figure 14E:
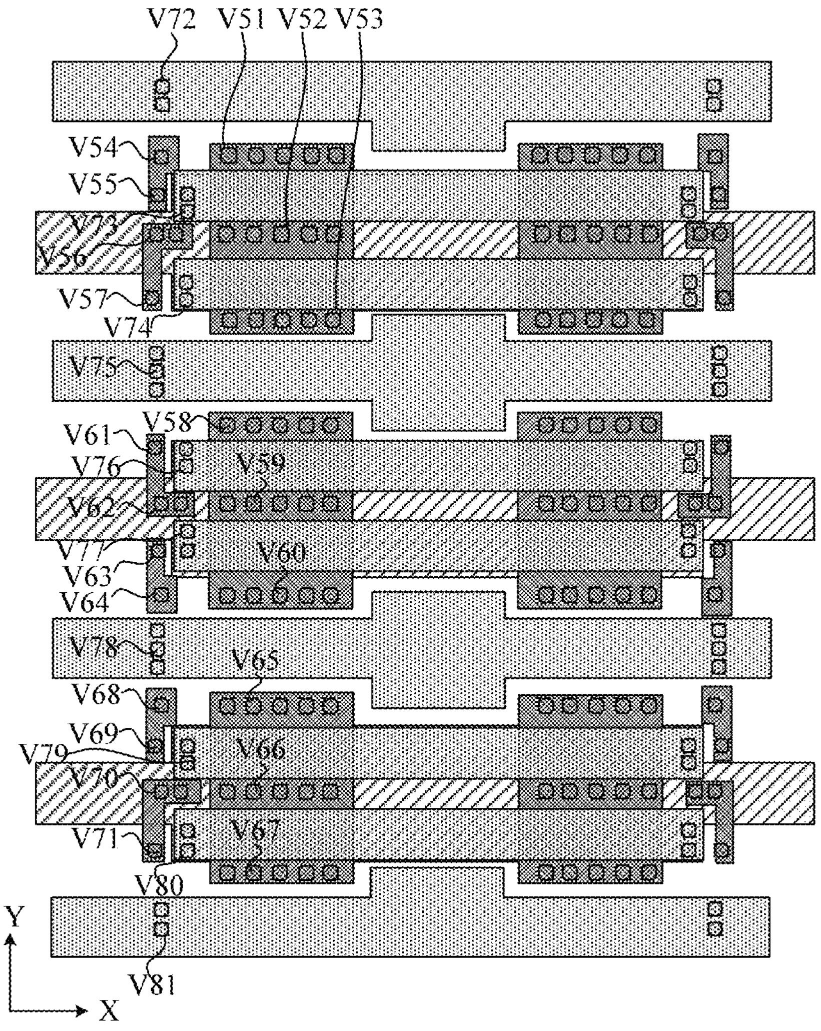
FIG. 14E is a schematic plan view of a first bezel region after a fourth insulation layer is formed in FIG. 14A.

FIG. 14A is another partial top view of a first bezel region according to at least one embodiment of the present disclosure. FIG. 14A illustrates a drive signal line and six second electro-static discharge circuits to which the drive signal line is electrically connected. FIG. 14B is a schematic plan view of a first bezel region after a second conductive layer is formed in FIG. 14A. FIG. 14C is a schematic plan view of a first bezel region after a semiconductor layer is formed in FIG. 14A. FIG. 14D is a schematic plan view of a first bezel region after a third conductive layer is formed in FIG. 14A. FIG. 14E is a schematic plan view of a first bezel region after a fourth insulation layer is formed in FIG. 14A.

In some examples, as shown in FIG. 14A, the six second electro-static discharge circuits to which the drive signal line 112 is electrically connected may be arranged in an array, for example, arranged in a 3×2 array. The second electro-static discharge circuits 22*c*, 22*e*, and 22*g* may be arranged in a column along the second direction Y, the second electro-static discharge circuits 22*d*, 22*f*, and 22*h* may be arranged in a column along the second direction Y, the second electro-static discharge circuits 22*c* and 22*d* may be arranged in a row along the first direction X, the second electro-static discharge circuits 22*e* and 22*f* may be arranged in a row along the first direction X, and the second electro-static discharge circuits 22*g* and 22*h* may be arranged in a row along the first direction X. The second electro-static discharge circuits 22*c* and 22*d* may be symmetrically disposed with respect to the drive signal line 112, the second electro-static discharge circuits 22*e* and 22*f* may be symmetrically disposed with respect to the drive signal line 112, and the second electro-static discharge circuits 22*g* and 22*h* may be symmetrically disposed with respect to the drive signal line 112. The second electro-static discharge circuits 22*c* and 22*e* may be symmetrically disposed with respect to a fifth connection line 555, and the second electro-static discharge circuits 22*d* and 22*f* may be symmetrically disposed with respect to the fifth connection line 555. The arrangement of the second electro-static discharge circuits according to the present example may be advantageous in saving occupied space.

In some examples, as shown in FIG. 14B, the second conductive layer of the first bezel region may include bottom gates of the oxide thin film transistors of the second electro-static discharge circuits (e.g., including: a bottom gate T52C of the fifth transistor T5C and a bottom gate T62C of the sixth transistor T6C of the second electrostatic discharge circuit 22*c*, a bottom gate T52D of the fifth transistor T5D and a bottom gate T62D of the sixth transistor T6D of the second electrostatic discharge circuit 22*d*, a bottom gate T52E of the fifth transistor T5E and a bottom gate T62E of the sixth transistor T6E of the second electrostatic discharge circuit 22*e*, a bottom gate T52F of the fifth transistor T5F and a bottom gate T62F of the sixth transistor T6F of the second electrostatic discharge circuit 22*f*, a bottom gate T52G of the fifth transistor T5G and a bottom gate T62G of the sixth transistor T6G of the second electrostatic discharge circuit 22*g*, and a bottom gate T52H of the fifth transistor T5H and a bottom gate T62H of the sixth transistor T6H of the second electrostatic discharge circuit 22*h*). The bottom gate T52C of the fifth transistor T5C and the bottom gate T62C of the sixth transistor T6C of the second electrostatic discharge circuit 22*c*, and the bottom gate T52D of the fifth transistor T5D and the bottom gate T62D of the sixth transistor T6D of the second electrostatic discharge circuit 22*d* may be of an integral structure, the bottom gate T52E of the fifth transistor T5E and the bottom gate T62E of the sixth transistor T6E of the second electrostatic discharge circuit 22*e*, and the bottom gate T52F of the fifth transistor T5F and the bottom gate T62F of the sixth transistor T6F of the second electrostatic discharge circuit 22*f* may be of an integral structure, and the bottom gate T52G of the fifth transistor T5G and the bottom gate T62G of the sixth transistor T6G of the second electrostatic discharge circuit 22*g*, and the bottom gate T52H of the fifth transistor T5H and the bottom gate T62H of the sixth transistor T6H of the second electrostatic discharge circuit 22*h* may be of an integral structure. For example, the integral structure of the bottom gates of the oxide thin film transistors of the second electro-static discharge circuit may be electrically connected to the third voltage line located in the fourth conductive layer.

In some examples, as shown in FIG. 14C, the semiconductor layer of the first bezel region may include active layers of transistors of a plurality of second electro-static discharge circuits, and a plurality of oxide connection blocks (e.g., including a fifth oxide connection block 605 to a fifteenth oxide connection block 615). An active layer T50C of the fifth transistor T5C and an active layer T60C of the sixth transistor T6C of the second electro-static discharge circuit 22*c* may be of an integral structure; an active layer T50D of the fifth transistor T5D and an active layer T60D of the sixth transistor T6D of the second electro-static discharge circuit 22*d* may be of an integral structure; an active layer T50E of the fifth transistor T5E and an active layer T60E of the sixth transistor T6E of the second electro-static discharge circuit 22*e* may be of an integral structure; an active layer T50F of the fifth transistor T5F and an active layer T60F of the sixth transistor T6F of the second electro-static discharge circuit 22*f* may be of an integral structure; an active layer T50G of the fifth transistor T5G and an active layer T60G of the sixth transistor T6G of the second electro-static discharge circuit 22*g* may be of an integral structure; an active layer T50H of the fifth transistor T5H and an active layer T60H of the sixth transistor T6H of the second electro-static discharge circuit 22*h* may be of an integral structure. The fifth oxide connection block 605 and the seventh oxide connection block 607 may be symmetrically disposed with respect to the drive signal line, the sixth oxide connection block 606 and the eighth oxide connection block 608 may be symmetrically disposed with respect to the drive signal line, the ninth oxide connection block 609 and the eleventh oxide connection block 611 may be symmetrically disposed with respect to the drive signal line, the tenth oxide connection block 610 and the twelfth oxide connection block 612 may be symmetrically disposed with respect to the drive signal line, the fourteenth oxide connection block 614 and the sixteenth oxide connection block 616 may be symmetrically disposed with respect to the drive signal line, and the thirteenth oxide connection block 613 and the fifteenth oxide connection block 615 may be symmetrically disposed with respect to the drive signal line. In this example, oxide connection blocks are used in the electrical connection paths among the transistors and the drive lead lines and the voltage lines, and the resistances of the connection paths can be increased, thereby protecting the components in the second electro-static discharge circuits and preventing electro-static discharge in the second electro-static discharge circuits.

In some examples, as shown in FIG. 14D, the third conductive layer of the first bezel region may include top gates of a plurality of second electro-static discharge circuits and a plurality of connection lines (e.g., a fourth connection line 554 to a seventh connection line 557). A top gate T61C of the sixth transistor T6C of the second electro-static discharge circuit 22*c* and a top gate T61D of the sixth transistor T6D of the second electro-static discharge circuit 22*d* may be of an integral structure, and a top gate T51C of the fifth transistor T5C of the second electro-static discharge circuit 22*c* and a top gate T51D of the fifth transistor T5D of the second electro-static discharge circuit 22*d* may be of an integral structure. A top gate T51E of the fifth transistor T5E of the second electro-static discharge circuit 22*e* and a top gate T51F of the fifth transistor T5F of the second electro-static discharge circuit 22*f* may be of an integral structure; a top gate T61E of the sixth transistor T6E of the second electro-static discharge circuit 22*e* and a top gate T61F of the sixth transistor T6F of the second electro-static discharge circuit 22*f* may be of an integral structure. A top gate T51G of the fifth transistor T5G of the second electro-static discharge circuit 22*g* and a top gate T51H of the fifth transistor T5H of the second electro-static discharge circuit 22*h* may be of an integral structure; and a top gate T61H of the sixth transistor T6H of the second electro-static discharge circuit 22*h* and a top gate T61H of the sixth transistor T6H of the second electro-static discharge circuit 22*h* may be of an integral structure.

In some examples, as shown in FIG. 14D, the fourth connection line 554 to the seventh connection line 557 may all extend in the first direction X and be sequentially arranged in the second direction Y. The fourth connection line 554 may be located at a side of the second electro-static discharge circuit 22*c* away from the second electro-static discharge circuit 22*e*, and may be configured to be electrically connected to the second voltage line. The fifth connection line 555 may be located between the second electro-static discharge circuits 22*c* and 22*e* and configured to be electrically connected to the first voltage line. The sixth connection line 556 may be located between the second electro-static discharge circuits 22*e* and 22*g* and configured to be electrically connected to the second voltage line. The seventh connection line 557 may be located at a side of the second electro-static discharge circuit 22*g* away from the second electro-static discharge circuit 22*e*, and may be configured to be electrically connected to the first voltage line.

In some examples, as shown in FIG. 14E, the fourth insulation layer of the first bezel region may be further provided with a plurality of vias, which may include, for example, a fifty-first via V51 to an eighty-first via V81. Herein, the fourth insulation layer and the third insulation layer in the fifty-first via V1 to the seventy-first via V71 may be removed to expose at least a portion of a surface of the semiconductor layer; the fourth insulation layer in the seventy-second via V72 to the eighty-first via V81 may be removed to expose at least a portion of a surface of the third conductive layer.

In some examples, as shown in FIG. 14A, the fourth conductive layer of the first bezel region may include a drive lead line 112, a plurality of connection electrodes (e.g., a twenty-first connection electrode 421 to a thirtieth connection electrode 430). In this example, description is made by taking the second electro-static discharge circuits 22*c*, 22*e*, and 22*g* as an example, and the film-layer connection relationship of the second electro-static discharge circuits 22*d*, 22*f*, and 22*h* may refer to the film-layer connection relationship of the second electro-static discharge circuits 22*c*, 22*e*, and 22*g*, and will not be repeated here.

In some examples, as shown in FIGS. 14A to 14E, the drive lead line 112 may be electrically connected to connection ends of the active layer T60C of the sixth transistor T6C and the active layer T50C of the fifth transistor T5C through a plurality of fifty-second vias V52 arranged laterally, and may also be electrically connected to the fifth oxide connection block 605 through the fifty-sixth via V56 to realize an electrical connection with the second electro-static discharge circuit 22c; may also be electrically connected with connection ends of the active layer T50E of the fifth transistor T5E and the active layer T60E of the sixth transistor T6E through a plurality of fifty-ninth vias V59 arranged laterally, and may also be electrically connected to the ninth oxide connection block 609 through the sixty-second via V62, to realize an electrical connection with the second electro-static discharge circuit 22e; may also be electrically connected with connection ends of the active layer T50G of the fifth transistor T5G and the active layer T60G of the sixth transistor T6G through a plurality of sixty-sixth vias V66 arranged laterally, and may also be electrically connected to the thirteenth oxide connection block 613 through the seventieth via V70, to realize an electrical connection with the second electro-static discharge circuit 22g. The drive lead line 112 may also be electrically connected to the second electro-static discharge circuits 22d, 22f, and 22h.

In some examples, as shown in FIGS. 14A to 14E, the twenty-first connection electrode 421 may be electrically connected to the fourth connection line 554 through a plurality of seventy-second vias V72 disposed vertically, may also be electrically connected to the sixth oxide connection block 606 through the fifty-fourth via V54, and also may be electrically connected to one end of the active layer T60C of the sixth transistor T6C through a plurality of fifty-first vias V51 disposed laterally. The fourth connection line 554 may be electrically connected to the first voltage line PL1. The twenty-second connection electrode 422 may be electrically connected to the sixth oxide connection block 606 through the fifty-fifth via V55, and may also be electrically connected to the top gate T61C of the sixth transistor T6C through a plurality of seventy-third vias V73 disposed vertically. The twenty-third connection electrode 423 may be electrically connected to the fifth oxide connection block 605 through the fifty-seventh via V57, and may also be electrically connected to the top gate T51C of the fifth transistor T5C through a plurality of seventy-fourth vias V74 disposed vertically. The twenty-fourth connection electrode 424 may be electrically connected to one end of the active layer T50C of the fifth transistor T5C through a plurality of fifty-third vias V53 disposed laterally, may also be electrically connected to the fifth connection line 555 through a plurality of seventy-fifth vias V75 disposed vertically, and may also be electrically connected to one end of the active layer T50E of the fifth transistor T5E through a plurality of fifty-eighth vias V58 disposed laterally. The twenty-fifth connection electrode 425 may be electrically connected to the ninth oxide connection block 609 through the sixty-first via V61, and may also be electrically connected to the top gate T51E of the fifth transistor T5E through the seventy-sixth via V76. The twenty-sixth connection electrode 426 may be electrically connected to the tenth oxide connection block 610 through the sixty-third via V63, and may also be electrically connected to the top gate T61E of the sixth transistor T6E through the seventy-seventh via V77. The twenty-seventh connection electrode 427 may be electrically connected to one end of the active layer T60E of the sixth transistor T6E through a plurality of sixtieth vias V60 disposed laterally, may also be electrically connected to the tenth oxide connection block 610 through the sixty-fourth via V64, may also be electrically connected to the sixth connection line 556 through a plurality of seventy-eighth vias V78 disposed vertically, may also be electrically connected to the fourteenth oxide connection block 614 through the sixty-eighth via V68, and may also be electrically connected to one end of the active layer T60G of the sixth transistor T6G through a plurality of sixty-fifth vias V65 disposed laterally. The twenty-eighth connection electrode 428 may be electrically connected to the fourteenth oxide connection block 614 through the sixty-ninth via V69, and may also be electrically connected to the top gate T61G of the sixth transistor T6G through the seventy-ninth via V79. The twenty-ninth connection electrode 429 may be electrically connected to the thirteenth oxide connection block 613 through the seventy-first via V71, and may also be electrically connected to the top gate T51G of the fifth transistor T5G through the eightieth via V80. The thirtieth connection electrode 430 may be electrically connected to one end of the active layer T50G of the fifth transistor T5G through a plurality of sixty-seventh vias V67 disposed laterally, and may also be electrically connected to the seventh connection line 557 through a plurality of eighty-first vias V81 disposed vertically.

Arrangement and connections of the second electro-static discharge circuits according to the present example not only facilitate to reducing occupied space, but may also facilitate the discharge of static electricity of the drive lead lines.

Figure 15:
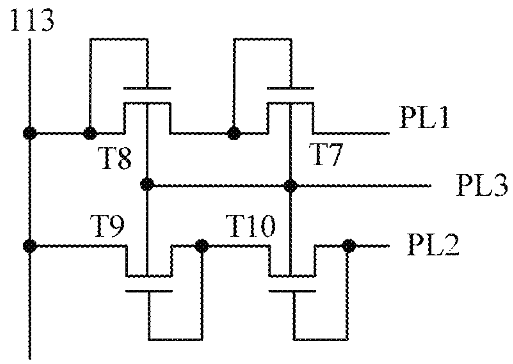
FIG. 15 is a circuit diagram of a third electro-static discharge circuit electrically connected with a drive signal line according to at least one embodiment of the present disclosure.

FIG. 15 is a circuit diagram of a third electro-static discharge circuit electrically connected with a drive signal line according to at least one embodiment of the present disclosure. In some examples, as shown in FIG. 15, one drive signal line 113 may be electrically connected to at least one third electro-static discharge circuit. The third electro-static discharge circuit may include four oxide thin film transistors, for example, may include a seventh transistor T7, an eighth transistor T8, a ninth transistor T9, and a tenth transistor T10. A first electrode of the seventh transistor T7 is electrically connected to a first voltage line PL1, and a top gate and a second electrode of the seventh transistor T7 are electrically connected to a first electrode of the eighth transistor T8; a top gate and a second electrode of the eighth transistor T8 are electrically connected to a first electrode of the ninth transistor T9, a top gate and a second electrode of the ninth transistor T9 are electrically connected to a first electrode of the tenth transistor T10, and a top gate and a second electrode of the tenth transistor T10 are electrically connected to a second voltage line PL2. The drive signal line 113 may be electrically connected to the top gate and the second electrode of the eighth transistor T8 and the first electrode of the ninth transistor T9. Bottom gates of the seventh transistor T7 to the tenth transistor T10 are electrically connected to a third voltage line PL3.

Figure 16A:
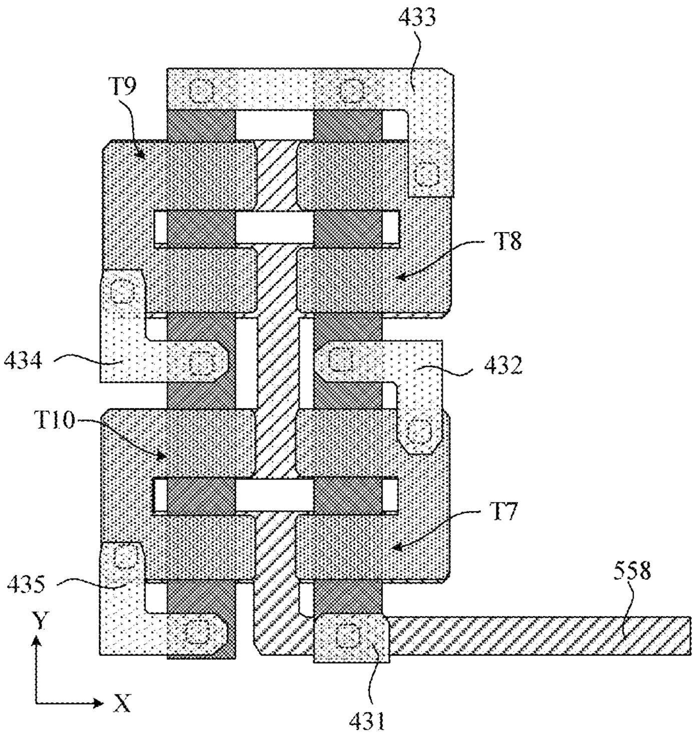
FIG. 16A is a partial top view of a third bezel region according to at least one embodiment of the present disclosure.
Figure 16B:
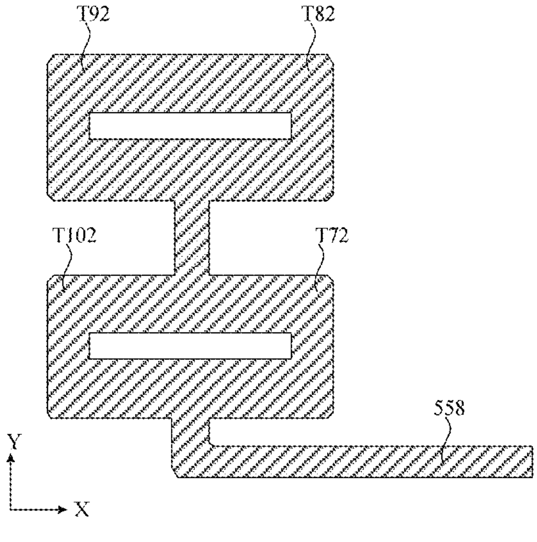
FIG. 16B is a schematic plan view of a third bezel region after a second conductive layer is formed in FIG. 16A.
Figure 16C:
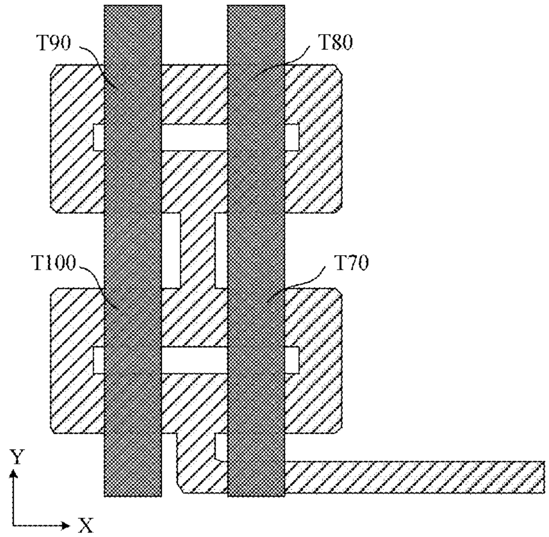
FIG. 16C is a schematic plan view of a third bezel region after a semiconductor layer is formed in FIG. 16A.
Figure 16D:
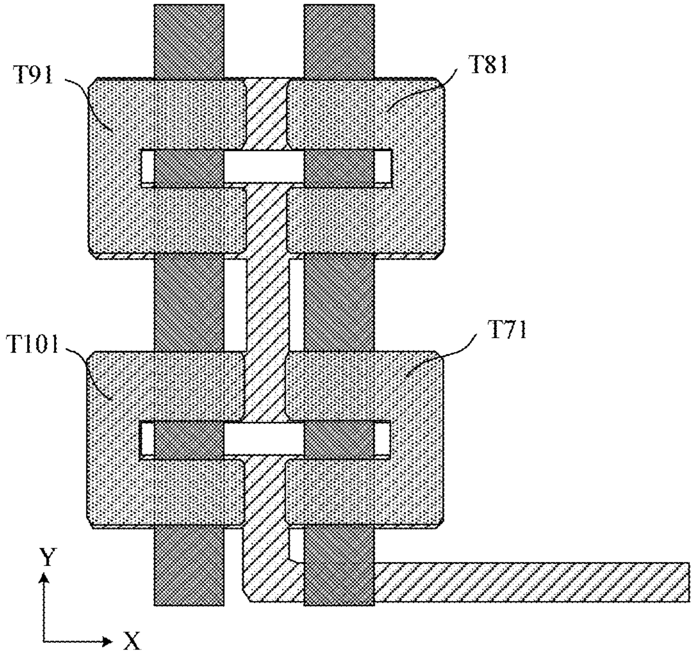
FIG. 16D is a schematic plan view of a third bezel region after a third conductive layer is formed in FIG. 16A.
Figure 16E:
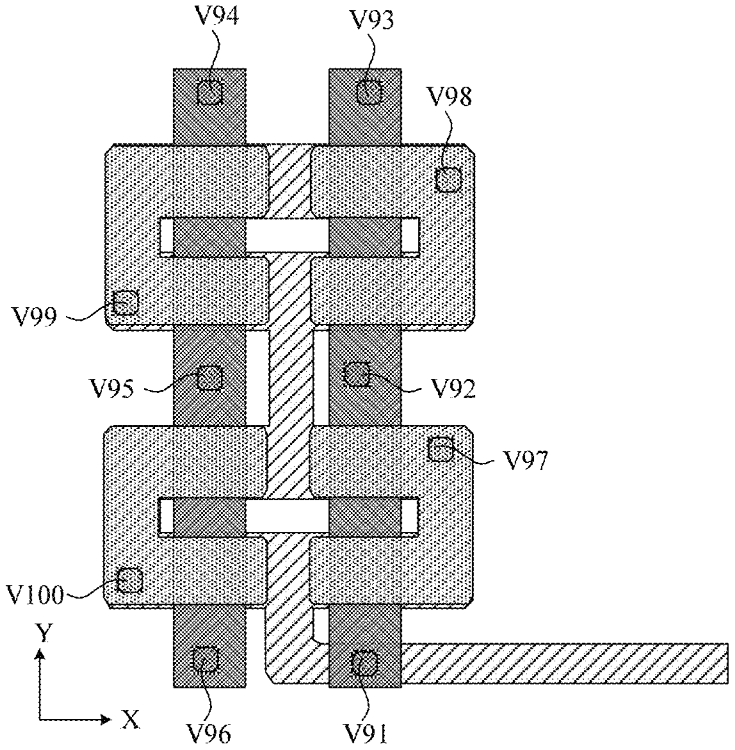
FIG. 16E is a schematic plan view of a third bezel region after a fourth insulation layer is formed in FIG. 16A.

FIG. 16A is a partial top view of a third bezel region according to at least one embodiment of the present disclosure. FIG. 16A illustrates a drive signal line and a third electro-static discharge circuit to which the drive signal line is electrically connected. FIG. 16B is a schematic plan view of a third bezel region after a second conductive layer is formed in FIG. 16A. FIG. 16C is a schematic plan view of a third bezel region after a semiconductor layer is formed in FIG. 16A. FIG. 16D is a schematic plan view of a third bezel region after a third conductive layer is formed in FIG. 16A. FIG. 16E is a schematic plan view of a third bezel region after a fourth insulation layer is formed in FIG. 16A.

In some examples, as shown in FIG. 16A, the four oxide thin film transistors of the third electro-static discharge circuit may be arranged in an array, for example, the seventh transistor T7 and the eighth transistor T8 may be arranged as a column along the second direction Y, the ninth transistor T9 and the tenth transistor T10 may be arranged as a column along the second direction Y, the seventh transistor T7 and the tenth transistor T10 may be arranged as a row along the first direction X, and the eighth transistor T8 and the ninth transistor T9 may be arranged as a row along the first direction X.

In some examples, as shown in FIG. 16B, the second conductive layer of the third bezel region may include bottom gates of the oxide thin film transistors of the third electro-static discharge circuit (e.g., including a bottom gate T72 of the seventh transistor, a bottom gate T82 of the eighth transistor, a bottom gate T92 of the ninth transistor, and a bottom gate T102 of the tenth transistor), and an eighth connection line 558. The bottom gate T72 of the seventh transistor, the bottom gate T82 of the eighth transistor, the bottom gate T92 of the ninth transistor, the bottom gate T102 of the tenth transistor, and the eighth connection line 558 may be of an integral structure. The eighth connection line 558 may be electrically connected to the third voltage line located in the fourth conductive layer.

In some examples, as shown in FIG. 16C, the semiconductor layer of the third bezel region may include active layers of the oxide thin film transistors of the third electro-static discharge circuit (e.g., including an active layer T70 of the seventh transistor, an active layer T80 of the eighth transistor, an active layer T90 of the ninth transistor, and an active layer T100 of the tenth transistor of the third electro-static discharge circuit). The active layer T70 of the seventh transistor and the active layer T80 of the eighth transistor may be of an integral structure, for example, a strip structure extending in the second direction Y. The active layer T90 of the ninth transistor and the active layer T100 of the tenth transistor may be of an integral structure, for example, a strip structure extending in the second direction Y.

In some examples, as shown in FIG. 16D, the third conductive layer of the third bezel region may include top gates of the oxide thin film transistors of the third electro-static discharge circuit (e.g., including a top gate T71 of the seventh transistor, a top gate T81 of the eighth transistor, a top gate T91 of the ninth transistor, and a top gate T101 of the tenth transistor). Orthographic projections of the top gate T71 of the seventh transistor and the top gate T81 of the eighth transistor on the base substrate may be in a shape of an "U" with an opening tilted to the left; and orthographic projections of the top gate T91 of the ninth transistor and the top gate T101 of the tenth transistor on the base substrate may be in a shape of an "U" with an opening tilted to the right. An orthographic projection of a top gate of an oxide thin film transistor on the base substrate may be located within a range of an orthographic projection of a bottom gate of the oxide thin film transistor on the base substrate. The seventh transistor, the eighth transistor, the ninth transistor, and the tenth transistor according to the present example may all have a double-gate structure, and the circuit stability can be improved.

In some examples, as shown in FIG. 16E, the fourth insulation layer of the third bezel region may include a plurality of vias, for example, may include a ninety-first via V91 to a hundredth via V100. The fourth insulation layer and the third insulation layer within the ninety-first via V91 to the ninety-sixth via V96 may be removed, exposing at least a portion of a surface of the semiconductor layer. The fourth insulation layer in the ninety-seventh via V97 to the hundredth via V100 may be removed, exposing at least a portion of a surface of the third conductive layer.

In some examples, as shown in FIGS. 16A to 16E, the fourth conductive layer of the third bezel region may at least include a plurality of connection electrodes (e.g., a thirty-first connection electrode 431 to a thirty-fifth connection electrode 435). The thirty-first connection electrode 431 may be electrically connected to one end of the active layer T70 of the seventh transistor through the ninety-first via V91, and the thirty-first connection electrode 431 may be electrically connected to the first voltage line, for example, integrally structured with the first voltage line. The thirty-second connection electrode 432 may be electrically connected to the connection ends of the active layer T70 of the seventh transistor and the active layer T80 of the eighth transistor through the ninety-second via V92, and may also be electrically connected to the top gate T71 of the seventh transistor through the ninety-seventh via V97. The thirty-third connection electrode 433 may be electrically connected to one end of the active layer T80 of the eighth transistor through the ninety-third via V93, may also be electrically connected to one end of the active layer T90 of the ninth transistor through the ninety-fourth via V94, and may also be electrically connected to the top gate T81 of the eighth transistor through the ninety-eighth via V98. The thirty-third connection electrode 433 may be electrically connected to the drive signal line, and may be integrally structured with the drive signal line, for example. The thirty-fourth connection electrode 434 may be electrically connected to connection ends of the active layer T90 of the ninth transistor and the active layer T100 of the tenth transistor through the ninety-fifth via V95, and may also be electrically connected to the top gate T91 of the ninth transistor through the ninety-ninth via V99. The thirty-fifth connection electrode 435 may be electrically connected to one end of the active layer T100 of the tenth transistor through the ninety-sixth via V96, and may also be electrically connected to the top gate T101 of the tenth transistor through the hundredth via V100. The thirty-fifth connection electrode 435 may be electrically connected to the second voltage line, and may be integrally structured with the second voltage line, for example. Orthographic projections of the thirty-second connection electrode 432, the thirty-third connection electrode 433, the thirty-fourth connection electrode 434, and the thirty-fifth connection electrode 435 on the base substrate may be substantially L-shaped.

In some examples, the structure of the third electro-static discharge circuit in the fourth bezel region may be similar to the structure of the third electro-static discharge circuit in the third bezel region, and will not be repeated here.

Arrangement of the third electro-static discharge circuit according to the present example is advantageous for saving occupied space and also advantageous for wiring of the drive signal line.

Figure 17:
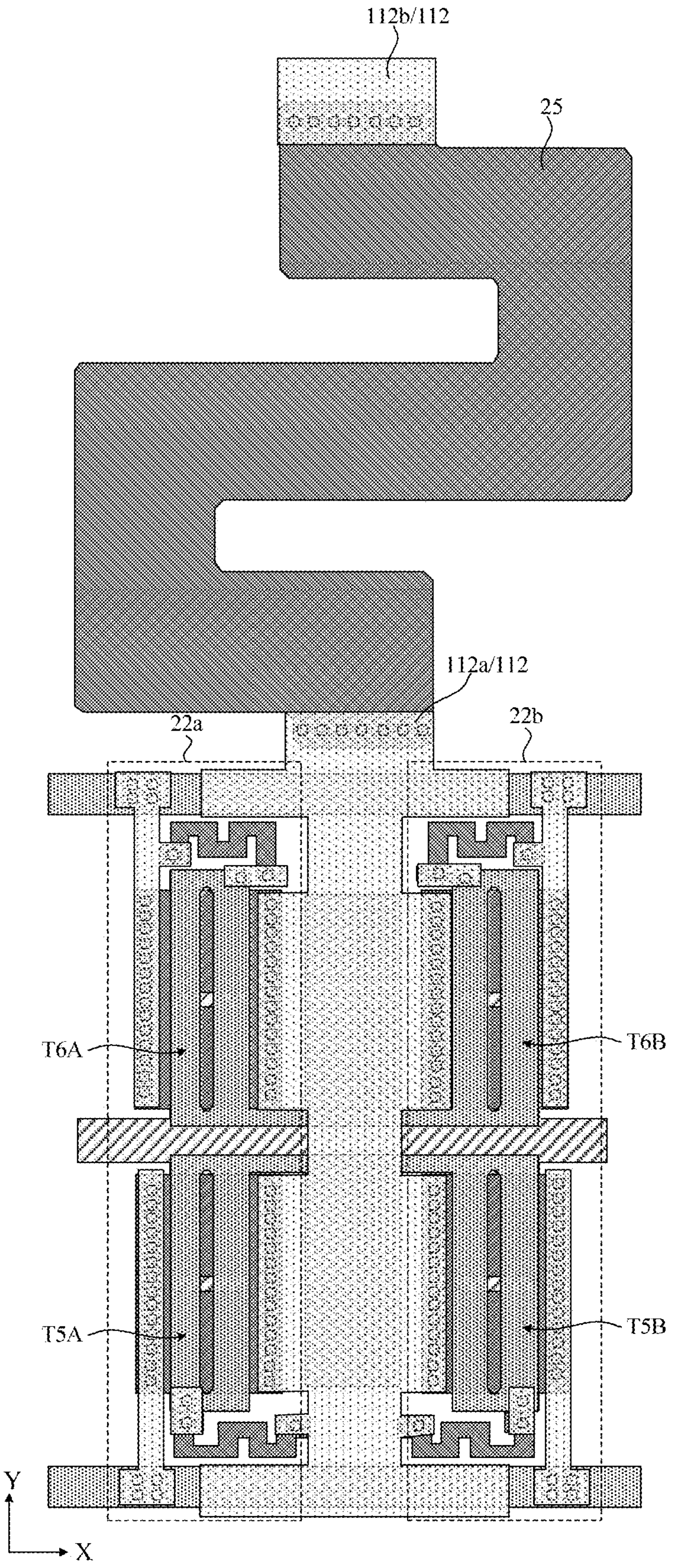
FIG. 17 is another partial top view of a first bezel region according to at least one embodiment of the present disclosure.
Figure 18:
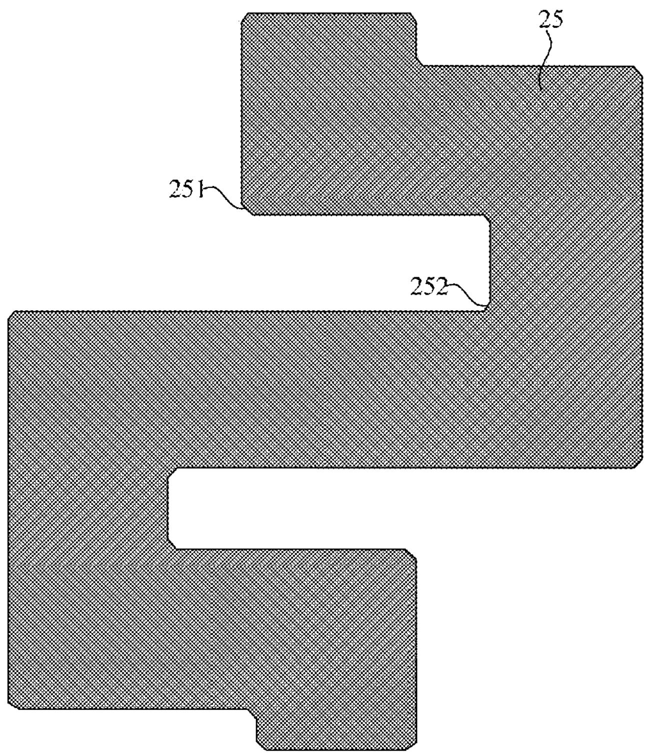
FIG. 18 is a schematic diagram of an auxiliary resistance trace in FIG. 17.

FIG. 17 is another partial top view of a first bezel region according to at least one embodiment of the present disclosure. FIG. 18 is a schematic diagram of an auxiliary resistance trace in FIG. 17. In some examples, as shown in FIG. 17, a drive lead line 112 may include a first trace 112*a* and a second trace 112*b*, the first trace 112*a* may be electrically connected to a plurality of second electro-static discharge circuits (including, for example, the second electro-static discharge circuits 22*a* and 22*b*), the first trace 112*a* and the second trace 112*b* may be electrically connected to the auxiliary resistance trace 25. For example, one end of the first trace 112*a* of the drive lead line 112 may extend to the signal access region and be electrically connected to the bonding pin of the signal access region, and the other end of the first trace 112*a* may be electrically connected to one end of the auxiliary resistance trace 25 through a plurality of vias provided in the fourth insulation layer. One end of the second trace 112*b* may be electrically connected to the other end of the auxiliary resistance trace 25 through a plurality of vias provided in the fourth insulation layer, and the other end of the second trace 112_b_ may extend to the third bezel region or the fourth bezel region, and be electrically connected to the drive signal line of the third bezel region or the fourth bezel region.

In some examples, taking the drive lead line 112 as a start signal lead line for transmitting a start signal as an example, by providing the start signal lead line to be electrically connected to the auxiliary resistance trace 25, the current of the start signal can be lowered and the voltage of the start signal lead line can be stabilized. However, the present embodiment is not limited thereto. In some other examples, the clock signal lead line, the data lead line, and the drive signal line may each be electrically connected to a corresponding auxiliary resistance trace to achieve voltage stabilization.

In some examples, as shown in FIG. 18, an orthographic projection of the auxiliary resistance trace 25 on the base substrate may be a serpentine trace. By providing the auxiliary resistance trace 25 as a serpentine trace, the resistance value of the auxiliary resistance trace can be increased by increasing the length of the auxiliary resistance trace, so that the resistance of the auxiliary resistance trace can play a role of lowering the current of the drive lead line, and the occupied space can be reduced. However, the present embodiment is not limited thereto. In some other examples, the auxiliary resistance trace may be in a structure of a strip with a larger width to meet the resistance requirements of lowering the current of the drive lead line.

In some examples, as shown in FIG. 18, the auxiliary resistance trace 25 may include an outer convex corner 251 and an inner concave corner 252. The outer convex corner 251 and the inner concave corner 252 may be chamfered to alleviate the stress concentration in the semiconductor layer where the auxiliary resistance trace is located.

In some examples, as shown in FIG. 5, the circuit structure and film layer structure of the fourth electro-static discharge circuit 24 may be similar to those of the second electro-static discharge circuit 22 described above, for example, the film layer structure of the fourth electro-static discharge circuit 24 may be similar to that shown in FIG. 14A. However, the present embodiment is not limited thereto.

In some other examples, a plurality of data lead lines in the peripheral region may be provided in the same layer, for example, they may all be located in the second conductive layer, and the peripheral region may not be provided with a first conductive layer. The bottom gates of the first electro-static discharge circuit, the second electro-static discharge circuit, and the third electro-static discharge circuit may be located on the first gate metal layer, and the top gates of the first electro-static discharge circuit, the second electro-static discharge circuit, and the third electro-static discharge circuit may be located on the second gate metal layer. However, the present embodiment is not limited thereto.

The present embodiment also provides a display substrate including a base substrate, at least one signal line, and at least one electro-static discharge circuit. The base substrate includes a display region and a peripheral region located on at least one side of the display region. At least one signal line and at least one electro-static discharge circuit located in the peripheral region. Each electro-static discharge circuit includes a plurality of transistors connected in series between a first voltage line and a second voltage line. At least one transistor of the plurality of transistors is an oxide thin film transistor. The oxide thin film transistor includes a top gate and a bottom gate, the bottom gate of the oxide thin film transistor is electrically connected to a third voltage line. A first voltage signal provided by the first voltage line is greater than a second voltage signal provided by the second voltage line and greater than a third voltage signal provided by the third voltage line. A signal line is electrically connected to the at least one electro-static discharge circuit, the signal line is configured to discharge static electricity through the at least one electro-static discharge circuit; a plurality of transistors in at least one electro-static discharge circuit to which the signal lines are electrically connected are arranged in an array, or a plurality of electro-static discharge circuits to which the signal lines are electrically connected are arranged in an array.

In the display substrate according to the present example, by electrically connecting the bottom gate of the oxide thin film transistor in the electro-static discharge circuit to the third voltage line, the threshold voltage of the oxide thin film transistor can be shifted to a positive value, so that the oxide transistor can be successfully turned off when the gate-source voltage difference is 0V, thereby improving the performance of the oxide thin film transistor in the electro-static discharge circuit, enhancing the stability of the electro-static discharge circuit, and thus improving the anti-static capability of the display substrate. Moreover, the electro-static discharge circuits according to the present example are arranged in an array, and a plurality of transistors in an electro-static discharge circuit are arranged in an array, which is beneficial to saving the occupied space of the electro-static discharge circuits, and is beneficial to realizing a narrow bezel design.

In some exemplary implementations, the display substrate includes a plurality of signal lines and a plurality of electro-static discharge circuits, the plurality of signal lines include: a plurality of data lead lines; the display region is provided with a plurality of data lines; the plurality of data lead lines are electrically connected to the plurality of data lines respectively; the plurality of electro-static discharge circuits include: a plurality of first electro-static discharge circuits, and at least one data lead line is electrically connected to at least one first electro-static discharge circuit; the first electro-static discharge circuit includes a plurality of oxide thin film transistors, and the plurality of oxide thin film transistors are arranged in an array at one side of the connected data lead line.

In some exemplary implementations, the plurality of signal lines further include a plurality of drive lead lines, and the plurality of electro-static discharge circuits further include a plurality of second electro-static discharge circuits; the plurality of second electro-static discharge circuits are located at a side of the plurality of first electro-static discharge circuits away from the display region. At least one drive lead line is electrically connected to at least two second electro-static discharge circuits, at least two second electro-static discharge circuits electrically connected to one drive lead line are arranged in an array, at least one second electro-static discharge circuit includes a plurality of oxide thin film transistors, and the plurality of oxide thin film transistors are arranged in an array at one side of the connected drive lead line.

In some exemplary implementations, the display substrate further includes: at least one auxiliary resistance trace located in the peripheral region; at least one signal line includes a first trace electrically connected to the at least one electro-static discharge circuit and a second trace located at a side of the first trace close to the display region, and the first trace and the second trace are electrically connected through the auxiliary resistance trace.

The structure of the display substrate of the present embodiment may be referred to the description of the foregoing embodiments and is therefore not described here.

Figure 19:
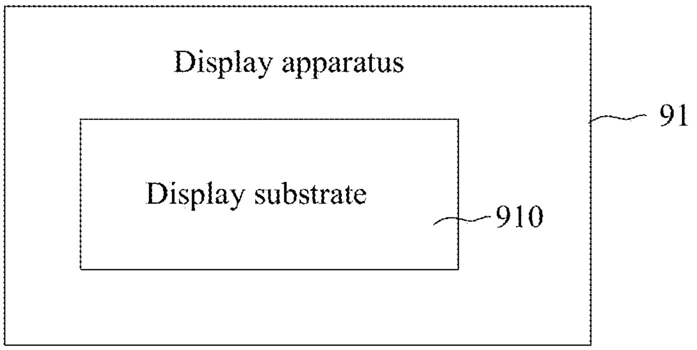
FIG. 19 is a schematic diagram of a display apparatus according to at least one embodiment of the present disclosure.

FIG. 19 is a schematic diagram of a display apparatus according to at least one embodiment of the present disclosure. In some examples, as shown in FIG. 19, the embodiment provides a display apparatus 91, including a display substrate 910 of the aforementioned embodiments. In some examples, the display substrate 910 may be an OLED display substrate, a QLED display substrate, a Micro-LED display substrate, or a Mini-LED display substrate. The display apparatus 91 may be any product or component with a display function, such as a mobile phone, a tablet computer, a television, a display, a laptop computer, a digital photo frame, and a navigator. However, the present embodiment is not limited thereto.

The drawings of the present disclosure only involve structures involved in the present disclosure, and other structures may refer to conventional designs. The embodiments of the present disclosure, i.e., features in the embodiments, may be combined with each other to obtain new embodiments if there is no conflict. Those of ordinary skills in the art should understand that modifications or equivalent replacements may be made to the technical solutions of the present disclosure without departing from the essence and scope of the technical solutions of the present disclosure, which shall all fall in the scope of the claims of the present application.

The invention claimed is:

1. An electro-static discharge circuit, comprising:

a first voltage line and a second voltage line, wherein a first voltage signal provided by the first voltage line is greater than a second voltage signal provided by the second voltage line;

a plurality of transistors connected in series between the first voltage line and the second voltage line; wherein at least one transistor of the plurality of transistors is an oxide thin film transistor, the oxide thin film transistor comprises a top gate and a bottom gate, and the bottom gate of the oxide thin film transistor is electrically connected to a third voltage line; the first voltage signal provided by the first voltage line is greater than a third voltage signal provided by the third voltage line.

2. The electro-static discharge circuit according to claim 1, wherein the third voltage signal provided by the third voltage line is less than the second voltage signal provided by the second voltage line.

3. The electro-static discharge circuit according to claim 1, wherein all transistors of the electro-static discharge circuit are oxide thin film transistors, and are N-type transistors.

4. The electro-static discharge circuit according to claim 3, comprising four oxide thin film transistors connected in series, wherein a first electrode of a first oxide thin film transistor is electrically connected to the first voltage line, a second electrode and a top gate of an i-th oxide thin film transistor are electrically connected to a first electrode of an (i+1)-th oxide thin film transistor, and a second electrode of a fourth oxide thin film transistor is electrically connected to the second voltage line, i is a positive integer greater than or equal to 1 and less than 4; and bottom gates of the four oxide thin film transistors are all electrically connected to the third voltage line; a top gate and a second electrode of a second oxide thin film transistor and a first electrode of a third oxide thin film transistor are all electrically connected to a signal input terminal.

5. The electro-static discharge circuit according to claim 3, comprising two oxide thin film transistors connected in series, wherein a first electrode of one oxide thin film transistor is electrically connected to the first voltage line, a top gate and a second electrode of the oxide thin film transistor are electrically connected to a first electrode of the other oxide thin film transistor and a signal input terminal, and a second electrode of the other oxide thin film transistor is electrically connected to the second voltage line; and bottom gates of the two oxide thin film transistors are all electrically connected to the third voltage line.

6. A display substrate, comprising:

a base substrate, comprising a display region and a peripheral region located on at least one side of the display region;

at least one signal line and at least one electro-static discharge circuit, located in the peripheral region; wherein each electro-static discharge circuit is connected between a first voltage line and a second voltage line, is electrically connected to a signal line, and is configured to provide an electro-static discharge path to the signal line;

wherein the electro-static discharge circuit comprises at least one oxide thin film transistor; the oxide thin film transistor comprises an active layer, a bottom gate and a top gate, the bottom gate is located on a side of the active layer close to the base substrate, the top gate is located on a side of the active layer away from the base substrate, and the bottom gate is electrically connected to a third voltage line; a first voltage signal provided by the first voltage line is greater than a second voltage signal provided by the second voltage line and greater than a third voltage signal provided by the third voltage line.

7. The display substrate according to claim 6, wherein an orthographic projection of the top gate of the oxide thin film transistor on the base substrate is located within a range of an orthographic projection of the bottom gate of the oxide thin film transistor on the base substrate.

8. The display substrate according to claim 6, wherein bottom gates of a plurality of oxide thin film transistors of the at least one electro-static discharge circuit are of an integral structure.

9. The display substrate according to claim 6, wherein the first voltage line, the second voltage line, and the third voltage line are located at a side of the top gate of the oxide thin film transistor away from the base substrate.

10. The display substrate according to claim 6, wherein the display region is provided with a plurality of data lines; the display substrate comprises a plurality of signal lines and a plurality of electro-static discharge circuits; the plurality of signal lines comprises: a plurality of data lead lines; the plurality of data lead lines are electrically connected to the plurality of data lines respectively;

the plurality of electro-static discharge circuits comprise: a plurality of first electro-static discharge circuits; at least one data lead line is electrically connected to at least one first electro-static discharge circuit; the at least one first electro-static discharge circuit is adjacent to the connected data lead line in a first direction, a first electro-static discharge circuit comprises a plurality of oxide thin film transistors, the plurality of oxide thin film transistors of the first electro-static discharge circuit are arranged along a second direction, and the first direction intersects the second direction.

11. The display substrate according to claim 10, wherein the plurality of data lead lines comprises a plurality of groups of data lead lines, at least one group of data lead lines comprises two adjacent data lead lines disposed in different layers, and orthographic projections of the two adjacent data lead lines on the base substrate do not overlap.

12. The display substrate according to claim 11, wherein first electro-static discharge circuits to which the two data lead lines of the at least one group of data lead lines are respectively electrically connected are located between the two data lead lines, adjacent in the second direction, and electrically connected to a same first voltage line.

13. The display substrate according to claim 12, wherein the first electro-static discharge circuits to which the two data lead lines of the at least one group of data lead lines are respectively electrically connected are disposed symmetrically with respect to the first voltage line.

14. The display substrate according to claim 11, wherein one of the at least one group of data lead lines and a bottom gate of an oxide thin film transistor of the connected first electro-static discharge circuit are disposed in a same layer, and the other data lead line is located at a side of the bottom gate of the oxide thin film transistor close to the base substrate.

15. The display substrate according to claim 6, comprising a plurality of signal lines and a plurality of electro-static discharge circuits, wherein the plurality of signal lines comprise a plurality of drive lead lines, the plurality of electro-static discharge circuits comprise a plurality of second electro-static discharge circuits; at least one drive lead line is electrically connected to at least two second electro-static discharge circuits; and at least two second electro-static discharge circuits electrically connected with one drive lead line are arranged in an array.

16. The display substrate according to claim 15, wherein the at least two second electro-static discharge circuits electrically connected with one drive lead line are disposed symmetrically with respect to the drive lead line.

17. The display substrate according to claim 6, comprising a plurality of signal lines and a plurality of electro-static discharge circuits, wherein the plurality of signal lines comprise a plurality of drive signal lines; the plurality of electro-static discharge circuits comprise a plurality of third electro-static discharge circuits; at least one drive signal line is electrically connected to at least one third electro-static discharge circuit; a third electro-static discharge circuit comprises four oxide thin film transistors connected in series, and the four oxide thin film transistors are arranged in an array.

18. The display substrate according to claim 6, further comprising: at least one auxiliary resistance trace located in the peripheral region; wherein the at least one signal line comprises a first trace electrically connected to the at least one electro-static discharge circuit and a second trace located at a side of the first trace close to the display region, and the first trace and the second trace are electrically connected through the auxiliary resistance trace.

19. A display apparatus, comprising a display substrate according to claim 6.

20. A display substrate, comprising:

a base substrate, comprising a display region and a peripheral region located on at least one side of the display region;

at least one signal line and at least one electro-static discharge circuit, located in the peripheral region; wherein each electro-static discharge circuit comprises a plurality of transistors connected in series between a first voltage line and a second voltage line, at least one transistor of the plurality of transistors is an oxide thin film transistor, the oxide thin film transistor comprises a top gate and a bottom gate, the bottom gate of the oxide thin film transistor is electrically connected to a third voltage line; a first voltage signal provided by the first voltage line is greater than a second voltage signal provided by the second voltage line, and greater than a third voltage signal provided by the third voltage line; and a signal line is electrically connected to the at least one electro-static discharge circuit, the signal line is configured to discharge static electricity through the at least one electro-static discharge circuit; a plurality of transistors in the at least one electro-static discharge circuit to which the signal line is electrically connected are arranged in an array, or a plurality of electro-static discharge circuits to which the signal line is electrically connected are arranged in an array.

* * * * *